(12) United States Patent  (10) Patent No.: US 9,331,258 B2
Toberer et al.  (45) Date of Patent: May 3, 2016

(54) SOLAR THERMOELECTRIC GENERATOR

(71) Applicant: Colorado School of Mines, Golden, CO (US)

(72) Inventors: Eric S. Toberer, Golden, CO (US); Lauryn L. Baranowski, Golden, CO (US); Emily L. Warren, Golden, CO (US)

(73) Assignee: Colorado School of Mines, Golden, CO (US)

( * ) Notice: Subject to any disclaimer, the term of this patent is extended or adjusted under 35 U.S.C. 154(b) by 0 days.

(21) Appl. No.: 14/190,064

(22) Filed: Feb. 25, 2014

(65) Prior Publication Data

US 2014/0290712 A1  Oct. 2, 2014

Related U.S. Application Data

(60) Provisional application No. 61/769,006, filed on Feb. 25, 2013.

(51) Int. Cl.
*H01L 35/00* (2006.01)
*H01L 35/30* (2006.01)
(Continued)

(52) U.S. Cl.
CPC ............... *H01L 35/30* (2013.01); *F24J 2/055* (2013.01); *F24J 2/07* (2013.01); *F24J 2/507* (2013.01); *H01L 35/00* (2013.01); *H01L 35/02* (2013.01); *H01L 35/32* (2013.01); *H01L 35/34* (2013.01)

(58) Field of Classification Search
CPC ......... H01L 31/00; H01L 31/02; H01L 31/04; H01L 31/32; H01L 31/34; H01L 3/00; H01L 3/02; H01L 3/04; H01L 3/32; H01L 3/3455

USPC .......................................................... 136/206
See application file for complete search history.

(56) References Cited

U.S. PATENT DOCUMENTS 389,124 A  9/1888  Weston
389,125 A  9/1888  Weston
(Continued)

FOREIGN PATENT DOCUMENTS

EP  2082442  7/2009
EP  2167881  3/2010
EP  2190041  5/2010

OTHER PUBLICATIONS

Kennedy, "Review of Mid-to-High Temperature Solar Selective Absorber Materials", NREL 2002.*
(Continued)

*Primary Examiner* — Matthew Martin
(74) *Attorney, Agent, or Firm* — Sheridan Ross P.C.

(57) ABSTRACT

Solar thermoelectric generators (STEGs) are solid state heat engines that generate electricity from concentrated sunlight. A novel detailed balance model for STEGs is provided and applied to both state-of-the-art and idealized materials. STEGs can produce electricity by using sunlight to heat one side of a thermoelectric generator. While concentrated sunlight can be used to achieve extremely high temperatures (and thus improved generator efficiency), the solar absorber also emits a significant amount of black body radiation. This emitted light is the dominant loss mechanism in these generators. In this invention, we propose a solution to this problem that eliminates virtually all of the emitted black body radiation. This enables solar thermoelectric generators to operate at higher efficiency and achieve said efficient with lower levels of optical concentration. The solution is suitable for both single and dual axis solar thermoelectric generators.

20 Claims, 31 Drawing Sheets

(51) Int. Cl.
  *H01L 35/02* (2006.01)
  *H01L 35/32* (2006.01)
  *H01L 35/34* (2006.01)
  *F24J 2/05* (2006.01)
  *F24J 2/07* (2006.01)
  *F24J 2/50* (2006.01)

(56) References Cited

U.S. PATENT DOCUMENTS

| | | | |
|---|---|---|---|
| 527,377 | A | 10/1894 | Severy |
| 527,379 | A | 10/1894 | Severy |
| 588,177 | A | 8/1897 | Regan, Jr. |
| 608,755 | A | 8/1898 | Cottle |
| 1,077,219 | A | 10/1913 | Coblentz |
| 3,130,084 | A | 4/1964 | Loring |
| 4,257,823 | A * | 3/1981 | Bevilacqua et al. .......... 136/206 |
| 4,553,531 | A | 11/1985 | Rosende |
| 2010/0252085 | A1 | 10/2010 | Gotthold et al. |

OTHER PUBLICATIONS

Chen, "Theoretical Efficiency of Solar Thermoelectric Energy Generators," J. Appl. Phys., 2011, vol. 109, pp. 104908-1 to 104908-8.

Kraemer et al., "High-Performance Flat-Panel Solar Thermoelectric Generators with High Thermal Concentration," Nature Materials, 2011, vol. 10(7), pp. 532-538.

McEnaney, et al., "Modeling of Concentrating Solar Thermoelectric Generators," J. Applied Phys., 2011, vol. 110, pp. 074502-1 to 074502-6.

Telkes, "Solar Thermoelectric Generators," J. Appl. Phys., 1954, vol. 25, pp. 765-777.

* cited by examiner

SOLAR THERMOELECTRIC GENERATOR

RELATED APPLICATION

This application claims the benefit of U.S. Provisional Patent Application Ser. No. 61/769,006, filed Feb. 25, 2013, the entire disclosure of which is incorporated by reference herein.

GOVERNMENT INTEREST

This invention was made with government support under award number DE-AR0670-4918 from the Advanced Research Projects Agency-Energy, U.S. Department of Energy. The Government has certain rights in the invention.

FIELD

A method and apparatus for a solar thermoelectric generator with improved efficiency is provided. More specifically, a solar thermoelectric generator with a thermal cavity to reduce the angle of blackbody emission is provided.

BACKGROUND

There are many technologies available to directly harness the sun's energy, the most prevalent of which are photovoltaics and solar thermal (also known as concentrated solar power or CSP). Installed CSP plants, which use conventional heat engines to generate electric power from a temperature gradient, typically operate at 14-16% efficiency. Solar thermal technologies produce electric power from a temperature gradient, traditionally by using conventional heat engines. Solid state heat engines, in the form of thermoelectric generators (TEGs), can also exploit this temperature gradient to generate power. Solar thermoelectric generators (STEGs) are solid state heat engines that generate electricity from concentrated sunlight. STEGs can operate at higher temperatures than CSP systems and do not require moving generator parts or working fluids.

Solar thermoelectric generators (STEGs), like photovoltaic systems and concentrating solar power plants, generate electricity by harnessing the energy of sunlight. Because STEGs are solid-state devices, their lack of moving parts or need for high-temperature operating fluids and their robustness in harsh environments make them an attractive technology for standalone power conversion or in hybrid solar-thermal systems. While the traditionally low efficiency of thermoelectric devices has relegated their use to such applications as waste heat recovery, recent improvements in thermoelectric devices may make STEGs a viable technology for direct solar-to-electric energy conversion.

Advances in thermoelectric (TE) materials have brought renewed attention to the potential for STEGs to serve as part of a renewable energy portfolio. Solar thermoelectric generators rely on the Seebeck effect, which describes the tendency of free charge carriers in a temperature gradient to diffuse from the hot to the cold side. These solid state devices are attractive for the following reasons: (a) the working fluid is simply charge carriers (electrons and holes), (b) they can operate at extremely high temperatures, enabling a high Carnot efficiency, (c) they are majority carrier devices which can tolerate high levels of defects compared to photovoltaic devices, and (d) all wavelengths of sunlight can be absorbed.

The first documented STEG design dates from 1888, when Weston patented a device that concentrated solar radiation onto a thermoelectric module with a black absorber surface. See U.S. Pat. Nos. 389,124 and 389,125 issued to Weston on Sep. 4, 1888, both of which are incorporated herein by reference in their entireties. Subsequently, U.S. Pat. Nos. 527,377 and 527,379, issued to Severy on Oct. 9, 1894, described a STEG that included a pump to supply cooling water to the cold side of the TE module, a battery to store the generated electrical energy, and an adjustable tracking device. The entire disclosures of the Severy patents are incorporated herein by reference in their entireties. U.S. Pat. No. 1,077,219, issued to Coblentz on Oct. 28, 1913 ("Coblentz"), describes the first experimental results for a STEG with a hot side temperature of 100° C. The entire disclosure of Coblentz is incorporated herein by reference in its entirety.

U.S. Pat. No. 588,177 issued to Reagan on Aug. 17, 1897 ("Reagan"), describes an application of solar heat to thermo batteries. The entire disclosure of Reagan is incorporated herein by reference in its entirety.

U.S. Pat. No. 608,755 issued to Cottle on Aug. 9, 1898 ("Cottle"), describes an apparatus for storing and using solar heat. The entire disclosure of Cottle is incorporated herein by reference in its entirety.

In 1954, Maria Telkes reported the first experimental STEG efficiency using flat-plate collectors in combination with a ZnSb/BiSb thermocouple. M. Telkes, Solar Thermoelectric Generators, J. APPL. PHYS. 1, 13, 25 (1954), the entire disclosure of which is incorporated herein by reference in its entirety. This device demonstrated 0.6% efficiency, which increased to 3.4% when a 50-fold concentrating lens was added. After this initial study, experimental STEG work has been intermittent, with low efficiency values due to relatively low hot side temperatures and the lack of vacuum encapsulation to prevent convective losses.

Telkes's 1954 results were not surpassed until 2011, when Kraemer, et al. experimentally demonstrated 4.6% efficiency in a Bi2Te3 nanostructured STEG. D. Kraemer, et al., *High-Performance Flat-Panel Solar Thermoelectric Generators with High Thermal Concentration*, NAT. MATER. 10, 532-538 (2011), the entire disclosure of which is incorporated herein by reference in its entirety. Important features of this design included a selective absorber as a thermal concentrator and the use of a vacuum enclosure to minimize conductive and convective losses. A summary of the experimental results to date (with references) can be found in Table A of the Appendix attached to the provisional application (U.S. Provisional Patent Application Ser. No. 61/769,006).

A paper by G. Chen entitled "Theoretical Efficiency of Solar Thermoelectric Energy Generators," modeled STEGs using a thorough the constant property model ("CPM") approach to highlight the important design variables. J. APPL. PHYS. 109, 104908 (2011), the entire disclosure of which is incorporated herein by reference in its entirety. Chen advocates for increasing the efficiency of the STEG by using a selective absorber to maximize the net flux into the thermal concentrator. Chen predicts that STEG efficiencies of approximately 12% can be achieved with 10-fold optical concentration and 200-fold thermal concentration, for a module operating at 527° C. with an average zT of 1.

A paper by McEnaney, et al. modeled segmented and cascaded $Bi_2Te_3$/skutterudite STEGs, using data from currently existing thermoelectric materials and selective surfaces. K. McEnaney, D. Kraemer, Z. F. Ren and G. Chen, *Modeling of Concentrating Solar Thermoelectric Generators*, J. APPL. PHYS. 110 (2011), the entire disclosure of which is incorporated herein by reference in its entirety. The efficiency of the cascaded design was predicted to be the highest, reaching 16% at 600° C. While this study did much to shed light on the important design variables of a STEG, the predicted device performance was determined by finite element modeling for a specific generator design and TE materials. Thus to date, STEG modeling efforts have been numerical approaches or have used CPM to address TE performance, limiting the applicability of these models.

SUMMARY

While solar-driven thermoelectric generators have been known for more than a century, the total efficiencies of these STEGs remain very low: below 5%. Further, there has not been any effort to decrease the radiative losses in a STEG via either (a) a narrow opening at the focal point of the concentrated solar flux or (b) photonic surfaces within a cavity that create angular-emission restrictions for decreased radiative losses. Note that the term "cavity" may be used interchangeably herein with "thermal cavity," "optical cavity," and "enclosure." All of the previous approaches have used a simple (possibly selective in wavelength) flat-plate absorber with no thermal shielding to decrease radiative losses. Prior STEGs also do not put the absorber beyond the focal point of the concentrating optics (also called an optical concentrator herein). Thus, it is one aspect of the present invention to provide a novel design for a STEG.

Another aspect of embodiments of the present invention is to provide high-efficiency, concentrated STEGs. STEGs have several advantages as compared to existing solar technologies. Unlike traditional solar thermal generators, STEGs are solid state devices with no moving parts, which greatly increase reliability and lifetime. Additionally, STEGs are a scalable technology that can be used for small- or large-scale applications. While photovoltaics are limited to the fraction of incident solar radiation above the bandgap, STEGs utilize a larger portion of the solar spectrum.

It is one aspect of embodiments the present invention to provide a generalized description of STEGs that is analytic and is not limited by the CPM. Optimized TE geometries, selective absorbers, and total efficiencies for given optical and thermal concentrations are considered. This global optimization is done from the view of a fixed hot side temperature, because of the inherent temperature limits of TE materials. Further, advanced TE materials' experimental data is used to design an optimized STEG module.

One aspect of embodiments of the present invention is to provide a STEG with five subsystems: (1) optical concentration; (2) thermal absorber; (3) thermoelectric module; (4) cooling system; and (5) vacuum encapsulation. The first subsystem is an optical system to concentrate the solar radiation. The second subsystem is a thermal absorber to convert the incident light to heat, which then flows to the thermoelectric module (the third subsystem). The cold side temperature of the TE is maintained by a passive or active cooling system (the fourth subsystem). Finally, the thermal absorber, TE module, and cooling system are encapsulated in a vacuum enclosure to prevent conductive and convective heat losses to the air. The vacuum enclosure could be similar to those used in evacuated solar hot water systems, which are widely used and have demonstrated lifetimes greater than 15 years.

Another aspect of embodiments of the present invention is to provide a STEG with three subsystems: the (1) solar absorber; (2) thermoelectric generator; and (3) heat management system.

It is a further aspect of the present invention to provide a STEG with improved efficiency. More specifically, a STEG with a total efficiency greater than 14% is provided. The total STEG efficiency is the product of the individual subsystems' efficiencies. Thus, the total efficiency of a STEG depends on the optical, absorber, and thermoelectric subsystem efficiencies.

It is one aspect of the present invention to provide a STEG that dramatically reduces the radiative losses from the absorber. In order for the thermal absorber to effectively convert the incident light to heat, the absorber surface must have a high absorptivity. However, by Kirchoff's Law, this also invokes a high emissivity, leading to large radiative losses. When past attempts have addressed this radiative loss problem, they have focused on using a selective absorber, which has energy dependent absorptivity/emissivity. For a high-temperature STEG, the radiative losses from the absorber account for a significant fraction of the STEG's efficiency losses. With today's absorbers, realistic efficiencies of the absorbers are almost 50%. As the total STEG efficiency is the product of the individual subsystem efficiencies, having an absorber with an efficiency below 50% is a serious loss to the STEG's overall efficiency.

One aspect of the present invention is to achieve high values of the hot side temperature (Th) by looking to high levels of optical concentration, as well as optical and thermal concentration systems with high efficiencies. The TE efficiency within the STEG is defined as the ratio of the output electric work to the input heat. Like all heat engines, the efficiency of TEGs is limited by the Carnot efficiency. For a fixed cold side temperature (Tc) an increase in the hot side temperature (Th) will result in a higher total efficiency of the thermoelectric generator.

One aspect of various embodiments the present invention is to provide a STEG with a thermoelectric material that generates a voltage in response to a temperature gradient. The efficiency of a thermoelectric material is governed by its figure of merit (zT) defined as $zT=(\alpha^2 T)/(\kappa\rho)$, where $\alpha$ is the Seebeck coefficient, $\kappa$ the thermal conductivity, and $\rho$ the electrical resistivity. Until recently, thermoelectric materials had demonstrated peak zT values of 0.5-0.8, leading to low conversion efficiencies and limiting these materials to niche applications. With the advent of nanostructured thermoelectrics and complex bulk materials in the 1990s, there has been a sharp increase in zT.

One aspect of embodiments of the present invention is to develop a novel detailed balance model for STEGs and apply this model to both state-of-the-art and idealized materials. This model uses thermoelectric compatibility theory to provide analytic solutions to device efficiency in idealized materials with temperature-dependent properties. The results of this modeling allow for predictions of maximum theoretical STEG efficiencies and suggestions of general design rules for STEGs. In one embodiment, with today's materials, a STEG with an incident flux of 100 kWm$^{-2}$ and a hot side temperature of 1000° C. could achieve 15.9% overall generator efficiency, making STEGs competitive with concentrated solar power plants. Future developments may depend on materials that can provide higher operating temperatures or higher material efficiency. For example, a STEG with zT=2 at 1500° C. would have an efficiency of 30.6%.

Thus, it is another aspect of the present invention to provide a STEG with a cavity, positioned above the absorber, which dramatically reduces the angle and amount of blackbody emission. This approach takes advantage of the concentration required to achieve the high temperatures (~1000° C.) of a high-efficiency STEG. In one embodiment, sunlight is concentrated down—through an optical concentrator—to a focal point and the absorber is put on the far side of this focal point. A cavity is constructed from the absorber up to the focal point and a pin-hole or other aperture in the cavity enables the concentrated light to enter the cavity. The walls of the cavity may exhibit low thermal conductivity (e.g., radiative baffling) and may be at a temperature close to the high temperature of the absorber. With a cavity, the dominant radiative loss is then restricted to a narrow angular range determined by the geometry of the cavity and the aperture. Thus, the directed nature of sunlight enables optical engineering to significantly decrease the radiative losses and thereby run a more efficient STEG with less solar concentration.

In one embodiment of the present invention, a detailed balance approach to deriving the maximum theoretical STEG efficiency is provided. The optimized STEG uses a solar selective absorber to efficiently capture the incident solar flux, while limiting radiative losses. We predict that a STEG made with today's materials (zT=1) and a hot side temperature of 1000° C. could achieve an efficiency of 15.9% under illumination by 100 suns. With reasonable improvements in thermoelectric materials (zT=2), we expect a limiting efficiency of 23.5% for the same hot side temperature and level of illumination.

In some embodiments, the STEG can operate as both as a standalone energy-conversion technology and as a topping cycle for existing concentrating solar power (CSP) technologies.

In one embodiment, the STEG comprises high-efficiency TEG couples to serve as the power-generating device. Maximizing the solar absorptance while minimizing losses due to blackbody radiation at the hot side is critical to maintaining high efficiency under solar illumination. Thus, in some embodiments, the STEG includes an improved solar-selective absorber coating that will allow for high absorptance over the solar spectrum while inhibiting emittance of the blackbody spectrum at 1000° C. The STEG design may also include a thermally insulating cavity that allows concentrated sunlight to enter through an aperture but further limit radiative losses.

In one embodiment, a solar-electrical generator is provided comprising: a radiation-capture structure having a front surface and a back surface, said front surface being adapted for exposure to solar radiation so as to generate heat; and at least one thermoelectric converter thermally coupled to said structure at a high-temperature end thereof to receive at least a portion of said generated heat such that a temperature differential is achieved across the at least one thermoelectric converter; wherein said radiation-capture structure comprises a capture area and the plurality of thermoelectric converters comprises a converter area, a ratio of capture area to converter area being greater than about 100.

In another embodiment, a electric generator powered by a solar thermal electric power source is provided comprising: a parabolic solar dish to collect and reflectively concentrate solar photon energy into a heat-containment housing, which may be a vacuum, that contains a heat absorber, which may be some black body heat absorber, to trap heat energy from the solar photon energy and that manages a thermal energy flow into a thermal electric generation device. The thermal electric generation device may be a TEG or a thermoelectric module. The solar thermal electric power source may also comprise a thermally cascading stack of multiple thermal electric cores in the thermal electric generation device, where each of the thermal electric cores is composed of pairs of P-type and N-type materials optimized for the thermal electric generation in specific temperature ranges and exhibit the thermal electric effect at progressively lower temperatures; bus bars coupled to the thermal electric generation device; and a collapsible base mount having a hollow tube for a vertical support and interconnects to the parabolic solar dish to structurally support the parabolic solar dish.

In some embodiments, the portable electric generator may further be provided wherein direct current (DC) electrical energy is drawn off each core stack of paired thermal electric material through positive and negative bus bars to contribute DC electricity to the bus bars to sum an efficiency of the heat energy to electrical generation conversion as each cascaded core stack generates DC electrical energy at progressively lower temperatures. In various embodiments, the portable electric generator may further be provided wherein individual thermal electric cores that are composed of pairs of P-type and N-type materials that are optimized for the highest thermal electric efficiency in the following temperature ranges and include, but are not limited to, materials listed below: 900° C. P=SiGe, 900° C. N=SiGe, 600° C. P=SnTe or $CeFe_4Sb_{12}$, 600° C. N=$CoSb_3$, 500° C. P=PbTe or TAGS or (Bix, Sbi-x) Te3, 500° C. N=PbTe (500° C. and below), 380° C. P=$Zn_4Sb_3$, 380° C. N=PbTe (500° C. and below), 160° C. P=$Bi_2Te_3$, 160° C. N=$Bi_2Te_3$. Additionally, the thermal electric cores composed of said P-type and N-type materials are separated by thermal throttles which maintain a uniform thermal flow such that the thermal electric core materials are maintained close to their optimum efficiency temperature within the stack.

In one embodiment, the portable electric generator is further provided wherein each thermal electric core in the stack is composed of a high density of P-type material and N-type material forming P-N junctions with one end of the P-type material and N-type material connected to an elevated temperature end thermally drawing heat from the black body heat absorber and the other end of the P-type material and N-type material connected to a lowered temperature end thermally connected to a heat sink. In another embodiment, the multiple core stack has three or more cascading temperature ranges with a different thermal electric material in each thermal electric core selected for an optimal temperature to generate electricity at each particular temperature range.

In one embodiment, a solar thermoelectric generator is provided comprising: an optical concentrator to concentrate solar flux at a focal point; a cavity comprising: a first end positioned proximate to the focal point; a second end; one or more walls extending from the first end to the second end; and an aperture positioned in the one or more walls and positioned at the focal point, wherein the aperture comprises a surface area which is smaller than a surface area of the second end of the cavity; a thermal absorber positioned proximate to the second end of the cavity, the thermal absorber comprising: an upper surface which has energy-dependent absorbtivity and emissivity; and a lower surface opposite the upper surface; a thermoelectric module positioned below the thermal absorber, the thermoelectric module comprising: a first thermoelectric leg comprising p-type material and having a hot end and a cold end, wherein the hot end is interconnected to the lower surface of the thermal absorber; a second thermoelectric leg comprising n-type material and having a hot end and a cold end, wherein the hot end is interconnected to the lower surface of the thermal absorber; and an electrical connector to electrically connect the cold end of the first thermoelectric leg to the cold end of the second thermoelectric leg; a cooling system positioned below the cold end of the first thermoelectric leg and the cold end of the second thermoelectric leg; and a vacuum enclosure positioned around the thermoelectric module and around at least a portion of the thermal absorber.

In further embodiments, the aperture is at least one of a pin-hole and a slit, the upper surface of the thermal absorber comprises a first layer, a second layer, and a substrate, and the first layer is a dielectric material and the second later is a metal material. In some embodiments, the upper surface of the thermal absorber comprises two or more selective absorber films, the cavity comprises a reflective material, and the cavity comprises at least one photonic surface on the one or more walls. In one embodiment, the at least one photonic surface creates angular-emission restrictions to decrease radiative losses and thermoelectric module further comprises insulation.

In one embodiment, a solar thermoelectric generator is provided comprising: an optical concentrator adapted to concentrate a solar flux; a thermal absorber comprising a first surface which has energy-dependent absorbtivity and emissivity, and a second surface opposite the first surface; a thermoelectric module provided proximal to the thermal absorber, the thermoelectric module comprising: (i) a first thermoelectric leg comprising a first end and a second end, wherein the first end is provided in contact with the second surface of the thermal absorber; (ii) a second thermoelectric leg comprising a first end and a second end, wherein the first end is interconnected to the second surface of the thermal absorber, and wherein the first thermoelectric leg is provided in electrical communication with the second thermoelectric leg; and an enclosure for receiving and reflecting at least a portion of the solar flux, the enclosure comprising: (i) an upper portion; (ii) a lower portion provided proximal to the thermal absorber; (iii) a predetermined height therebetween the upper portion and lower portion; and (iv) an internal cavity; wherein the upper portion comprises an aperture for receiving at least a portion of the solar flux from the optical concentrator and transmitting at least a portion of the solar flux to the internal cavity; and wherein the internal cavity comprises a reflective material.

Further embodiments may include a vacuum enclosure positioned around the thermoelectric module and around at least a portion of the thermal absorber, the enclosure comprises a frustoconical member, and the aperture comprises a surface area which is smaller than a surface area of the thermal absorber. Some embodiments may also include a cooling system in thermally conductive communication with at least one of the first thermoelectric leg and the second thermoelectric leg.

One embodiment of the present invention provides a method of manufacturing a solar thermoelectric generator comprising: providing an optical concentrator adapted to concentrate a solar flux; providing a thermal absorber comprising a first surface which has energy-dependent absorbtivity and emissivity, and a second surface opposite the first surface; providing a thermoelectric module proximal to the thermal absorber; providing an enclosure for receiving and reflecting at least a portion of the solar flux, the enclosure comprising: (i) an upper portion; (ii) a lower portion proximal to the thermal absorber; and (iii) an internal cavity comprising a reflective material; providing an aperture in the upper portion of the enclosure; receiving at least a portion of the solar flux from the optical concentrator; transmitting the at least a portion of the solar flux through the aperture to the thermal absorber; reflecting solar flux emitted from the thermal absorber back to the thermal absorber; and converting the solar flux into electricity. In further embodiments, the STEG may be portable.

By way of providing additional background, context, and to further satisfy the written description requirements of 35 U.S.C. §112, the following references are incorporated by reference in their entireties for the express purpose of explaining the nature of solar thermoelectric generators and to further describe the various methods, tools, components, pieces, and other apparatuses commonly associated therewith:

U.S. Pat. No. 3,130,084, issued to Loring on Apr. 21, 1964, describes a solar thermoelectric generator;

U.S. Pat. No. 4,553,531, issued to Rosende on Nov. 19, 1985, describes a solar radiation collector;

U.S. Patent Pub. No. 2010/0252085 to Gotthold describes a portable direct solar thermoelectric generator;

European Patent Pub. No. 2190041 to Chen describes solar thermoelectric conversion;

European Patent Pub. No. 2082442 to Chen describes solar thermoelectric conversion; and European Patent Pub. No. 2167881 to Chen describes solar thermoelectric and thermal cogeneration.

BRIEF DESCRIPTION OF THE DRAWINGS

Those of skill in the art will recognize that the following description is merely illustrative of the principles of the invention, which may be applied in various ways to provide many different alternative embodiments. This description is made for illustrating the general principles of the teachings of this invention and is not meant to limit the inventive concepts disclosed herein.

The accompanying drawings, which are incorporated in and constitute a part of the specification, illustrate embodiments of the invention and together with the general description of the invention given above and the detailed description of the drawings given below, serve to explain the principles of the invention.

Figure 1:
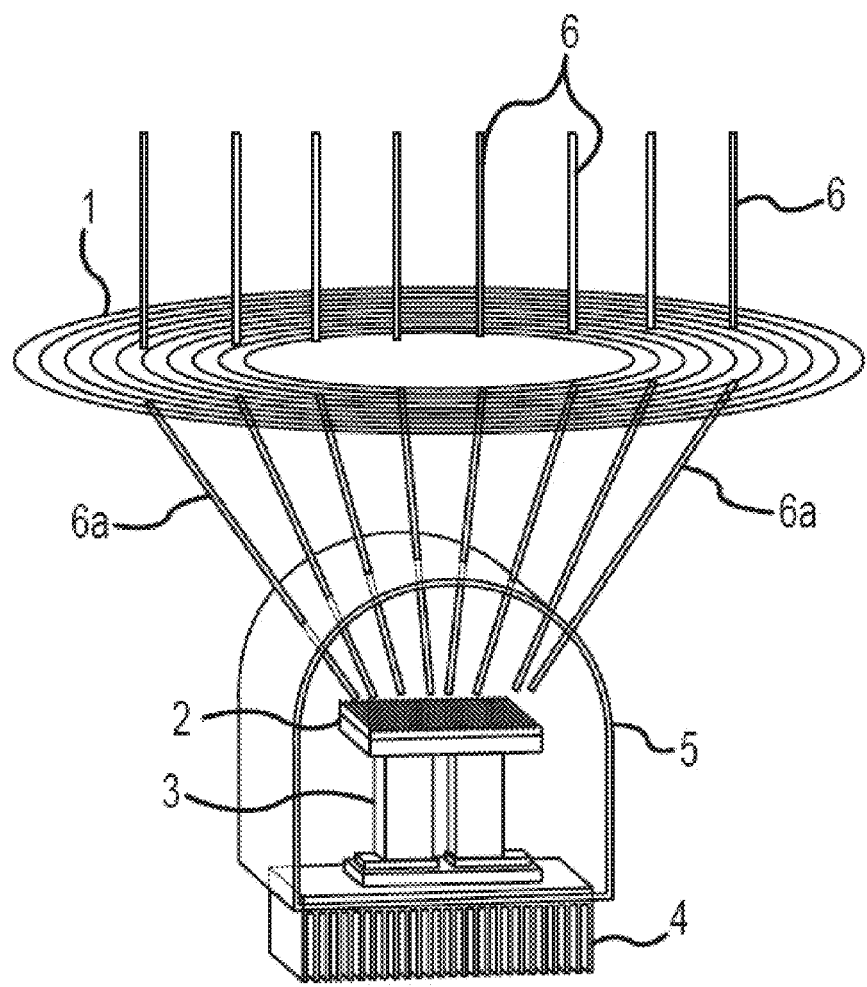
FIG. 1 is one embodiment of a STEG with five subsystems.

To assist in the understanding of the embodiments of the present invention the following list of components and associated numbering found in the drawings is provided herein:

1 Optical Concentration System
2 Thermal Absorber System
3 Thermoelectric Module
4 Cooling System
5 Vacuum Encapsulation
6 Sunlight
6a Concentrated Sunlight
6b Reflected or Radiated Light
7 Optical Concentrator
8 Heat Absorbed
10 Substrate
11 Parabolic Mirror
12 Vacuum Tube
13 Cooled Side of STEG (Active Cooling)
14 Insulation
15 TEG Component
16 Metal Foil Baffles
17 Absorber
20 Absorber Surface
22 Leg of TE Module (P-type semiconductor)
24 Leg of TE Module (N-type semiconductor)
30 TEG Module
31 Current
32 Hot Side of TE Module Leg
33 External Electrical Connection
34 Cold Side of TE Module Leg
35 Heat Rejected
36 Hot Side of TE Module Leg
37 Heat Flow
38 Cold Side of TE Module Leg
39 Metal Interconnects
40 TE Module
42 Hot-side TE Segment
44 Compliant Interface
46 Cold-side TE Segment
60 Focal Point
80 Stand
82 Feed-through
84 Port
86 Thermoelectric Stage
88 Waist
90 Parabolic Trough Single Axis System
92 (Optical) Cavity
94 Solar Selective Absorber
96 Walls of Cavity
98 Aperture
100 Mirror Array
101 STEG with a Secondary Optical System
102 Pinhole
104 Vacuum Chamber
106 Mirror
108 Window
110 Secondary Optic
112 Optical Port
114 Post
116 Compression Plate
118 Film (for Selective Absorber)
120 Pad
122 Solar Thermoelectric Generator (STEG)

It should be understood that the drawings are not necessarily to scale, and various dimensions may be altered. In certain instances, details that are not necessary for an understanding of the invention or that render other details difficult to perceive may have been omitted. It should be understood, of course, that the invention is not necessarily limited to the particular embodiments illustrated herein.

DETAILED DESCRIPTION

To provide further clarity to the detailed description provided herein in the associated drawings, the following list of variables and their definitions are provided as follows:

| Symbol | Definition |
| --- | --- |
| $T_h$ | TE hot side temperature |
| $T_{abs}$ | Temperature of the absorber surface |
| $\gamma_{th}$ | Thermal concentration |
| $\eta_{op}$ | Optical efficiency |
| $\eta_{abs}$ | Absorber efficiency |
| $\eta_{TE}$ | Thermoelectric efficiency |
| $\eta_{STEG}$ | STEG efficiency, $\eta_{abs} * \eta_{TE}$ |
| $q''_{inc}(E)$ | Spectral energy flux incident on the absorber surface |
| $q''_{ref}(E)$ | Spectral energy flux reflected from absorber surface |
| $q_{abs}$ | Heat absorbed by the absorber surface |
| $q_{TE,in}$ | Heat transferred to the TE leg |
| $q_{rad}$ | Heat lost radiatively from the absorber surface |
| $q''_{bb(E)}$ | Spectral black body emission flux |
| $A_{abs}$ | Area of the absorber surface |
| $A_{TE}$ | Area of the TE leg |
| $l_{TE}$ | Length of the TE leg |
| $\kappa_{eff}$ | TE effective thermal conductivity |
| $L_{th}$ | Thermal length, $\gamma_{th} l_{TE}$ |

STEGs operate by absorbing sunlight, which generates a temperature gradient, which in turn, generates electricity through the Seebeck effect. The efficiency of a STEG, therefore, depends on both the efficiency with which sunlight is converted to heat and on the thermoelectric efficiency of the device. The thermoelectric efficiency depends on the temperature difference across the device and the temperature-dependent figure of merit of the thermoelectric materials, $zT=(S^2\sigma/k)T$, where S is the Seebeck coefficient, $\sigma$ is the electrical conductivity, k is the thermal conductivity, and T is the absolute temperature. The maximum efficiency of a TEG is given by $$\eta_{TE} = \left(1 - \frac{T_C}{T_H}\right) \frac{\sqrt{1+ZT} - 1}{\sqrt{1+ZT} + \frac{T_C}{T_H}} \quad (0)$$

Here, the term in parentheses is the Carnot efficiency, where $T_h$ is the temperature of the hot side of the device, $T_c$ is the cold-side temperature, Z is the effective figure of merit across the temperature gradient, and $T=(T_h+T_c)/2$.

FIG. 1 shows an embodiment of a STEG receiving sunlight 6. The STEG may be broken down into five subsystems: the optical concentration system 1, the thermal absorber 2, the thermoelectric module 3, the cooling system 4, and the vacuum encapsulation 5. Some embodiments (e.g., those shown in FIGS. 6-10) also include a sixth subsystem: the cavity. The cavity is further described below in accordance with FIGS. 6-10.

The first subsystem of a STEG is the optical concentration system 1. In some embodiments, optical concentration systems 1 for high efficiency STEGs may be the same as those used for concentrated photovoltaic or solar thermal applications. Examples include Fresnel lenses, heliostats in conjunction with a central receiver system, and parabolic dishes and troughs. For use in a STEG, the pertinent characteristics are the level of concentration reached, the tracking system required, and the optical efficiency.

The optical concentration ratio is defined as the ratio of the optical concentrator area (i.e., the area of the lens or mirror that receives the incident light) to the absorber area upon which the light is focused. Considering one sun to be approximately 1 kW/m², the flux after concentration is given by this solar flux multiplied by the optical concentration ratio. The concentration ratio is mainly limited by the type of solar tracking used. For a static concentrator, with no tracking, the optical concentration ratio is limited to about 10. When single-axis tracking is introduced, a concentration ratio of 100 can be achieved, above which dual-axis tracking systems are required.

The optical efficiency is the ratio of light that reaches the absorber to the total light incident upon the optical concentrator, and increases with improved tracking systems. Typical optical efficiencies are 40% for static concentrators, 60% for single-axis tracking, and 85-90% for dual-axis tracking. With dual-axis tracking, the optical losses of the tracking system itself are very low; other losses due to factors such as soiling of the lens surface, reflection, and absorption are still present. Additionally, increased tracking increases the system cost.

Figure 10:
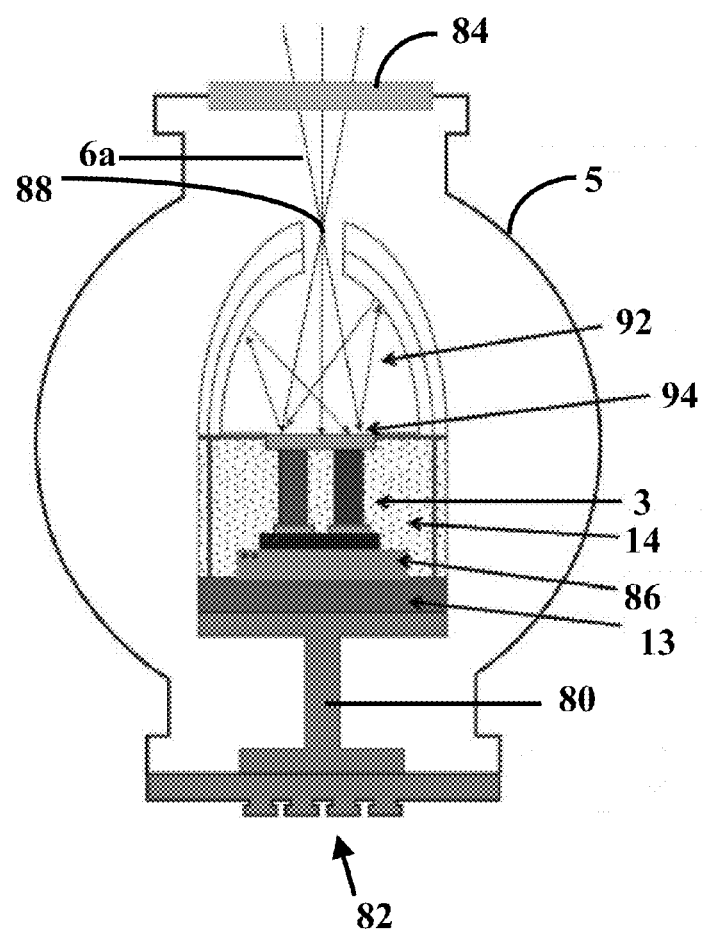
FIG. 10 is the STEG of FIG. 9 inside a vacuum encapsulation.

To reach the targeted hot-side temperature of 1000° C., we will employ optical concentration of the incoming sunlight. As discussed above, with sufficient suppression of heat losses, through the use of a selective absorber, cavity, and vacuum enclosure, an optical concentration at the absorber surface <300 Suns should be sufficient. However, as depicted in FIGS. 10 and 20a, the use of the thermally insulating cavity requires that the sunlight be focused to a waist to enter the cavity and then diverge to completely irradiate the absorber surface. Therefore, the maximum optical concentration in the system, which occurs at the focus, will be determined by the size of the cavity's aperture and the divergence of the beam.

The thermal cavity requires that the beam enter through an aperture that is smaller than the absorber and diverge to completely irradiate the absorber surface. Therefore, to capitalize on the improved absorber efficiency afforded by the thermal cavity, we must add secondary optics to tailor the incoming beam to the STEG prototype. To accommodate the small size of the STEG and aperture in the cavity, we will place secondary focusing optics in the beam path to further tighten the beam waist. We have modeled a series of lenses with different numbers of primary mirrors to identify the optimum optical components for integrating the STEG prototype into the HFSF. The key parameters for selection are: (i) the area of the beam at the waist, which defines the aperture in the cavity, (ii) the distance from the focus at which the beam completely fills the absorber area, which defines the height of the cavity, and (iii) the intensity at the absorber surface. Table 1 shows the modeling results of placing a 5-cm diameter aperture and lens at the focus of the primary concentrator. We find that the beam waist decreases with decreasing focal length, but the divergence increases, decreasing both the height and average intensity at the absorber. While using more mirrors increases the intensity, this also increases the waist and decreases the height. The 3-mirror subarray with a 6-cm focal length lens should deliver sufficient intensity while allowing for a cavity with a small aperture for efficient solar absorption.

Figure 2:
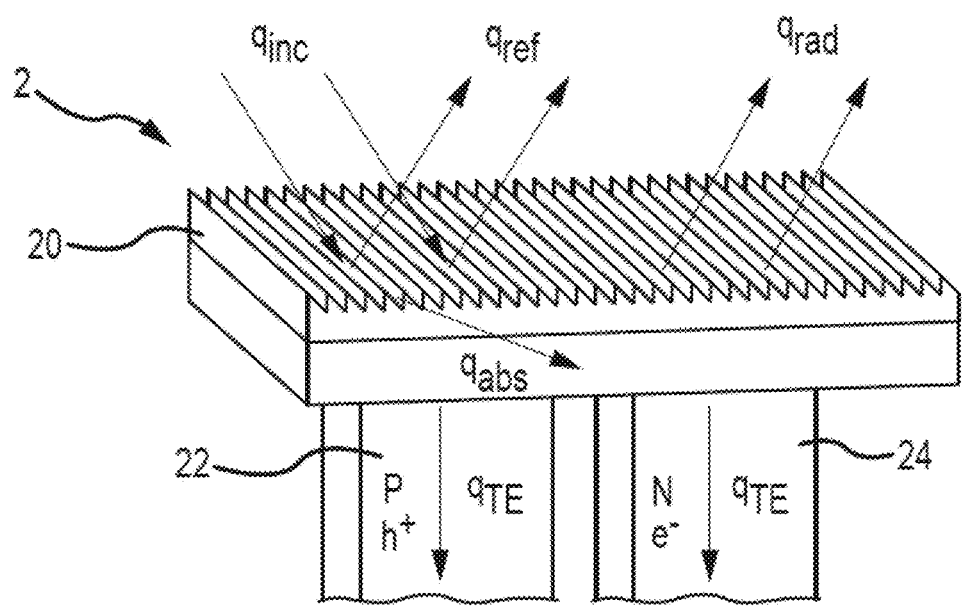
FIG. 2 shows energy incident upon one embodiment of a selective absorber.
Figure 5:
FIG. 5 is one embodiment of a selective absorber.

FIG. 2 shows the second subsystem, which is the thermal absorber 2. In order for the thermal absorber 2 to effectively convert the incident light to heat, the surface must have a high absorptivity. Efficient conversion of sunlight to heat requires an absorber surface 20 with high absorptivity over the solar spectrum. However, by Kirchoff's Law, this also invokes a high emissivity, leading to large radiative losses. This conflict can be resolved with a solar-selective absorber. An ideal solar-selective absorber has unity absorptance in the short-wavelength range of the solar spectrum with a step transition to zero absorptance in the infrared region to prevent emittance of blackbody radiation. The transition occurs at a cutoff wavelength that depends both on the temperature of the absorber surface and the optical concentration. In one embodiment, a multilayer solar-selective coating based on inherently high-temperature oxidation-resistant TiSi materials intended for operation at 500° C. is used. The deposited 9-layer coating achieved a measured absorptance of 0.937 and emittance of 0.24 at room temperature and 0.34 at 500° C. One example of a multilayer selective absorber film is shown in FIG. 5.

The 1000° C. operating temperature of the STEG requires modification of the multilayer coating to optimize performance at the elevated temperature. Optimization includes changes in layer thicknesses and a lower targeted cutoff wavelength. The predicted performance of this design (a 9-layer stack optimized for 1000° C.) is better than any commercially available product, with average absorption of 0.976 over the band from 300-1300 nm and total solar-weighted absorptance of 0.938. The calculated emittance of the design is 0.21. After annealing at 1000° C., the film retains a high room-temperature absorptance of 0.884. However, the infrared reflectance is lower than predicted. Measuring the optical properties of annealed individual layers to use as inputs in the model (rather than literature values) improves the as-deposited performance. Different deposition conditions to produce films with better purity of the targeted crystalline phases for the individual layers and examining alternate material systems may be used to improve the selectivity of the deposited films.

FIG. 2 depicts an embodiment of energy incident ($q_{inc}$) upon a selective absorber 2. The energy incident $q_{inc}$ is either absorbed ($q_{abs}$) or reflected ($q_{ref}$) via the absorber surface 20. Some of the absorbed energy $q_{abs}$ re-radiated to the atmosphere ($q_{rad}$) and the rest of the absorbed energy $q_{abs}$ is transferred to the TE module ($q_{TE}$) through the legs 22, 24 of the TE module. In some embodiments, the selective absorber 2 may comprise insulation to prevent heat loss on the back side and sides of the absorber (not shown).

In one embodiment, the entire system view of the heat fluxes in the STEG can be modeled. From FIG. 2, we can write a heat balance for the absorber:

$$q_{abs} = q_{TE} + q_{rad} \quad (1)$$

Maximizing $q_{TE}$ for a given $q_{inc}$ (and thus ($q_{abs}$), requires minimizing $q_{rad}$. Here we model the effects of radiation shielding on $q_{rad}$ and the resultant subsystem and STEG efficiencies.

Figure 3:
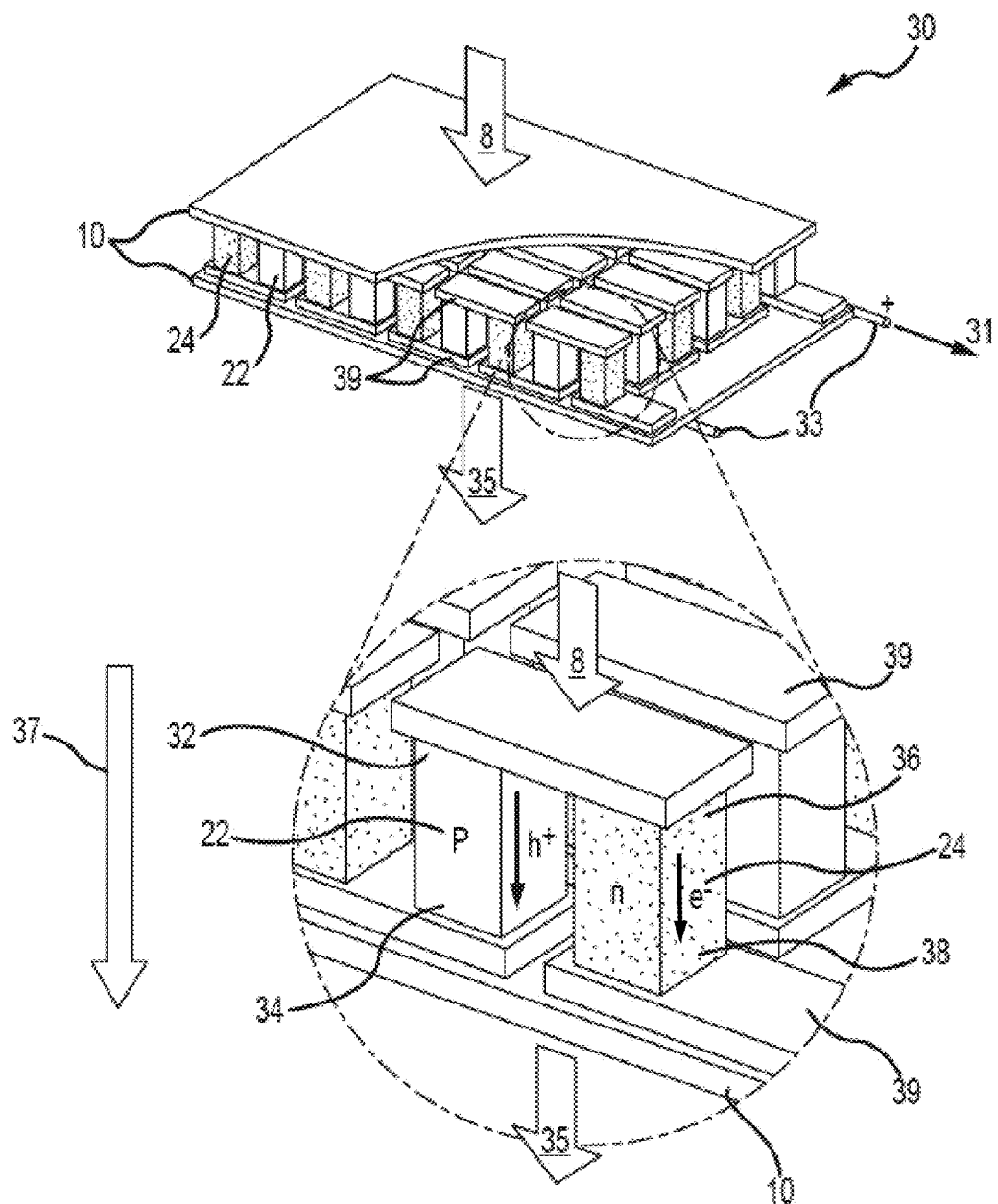
FIG. 3 shows one embodiment of a thermoelectric module.

The third subsystem is the thermoelectric module 3. FIG. 3 shows one embodiment of a thermoelectric module 3. The module 3 has unicouples linked electrically in series. The thermoelectric modules 3 consist of n-type and p-type materials that are electrically connected. When a load is connected across the cold ends, the Seebeck effect will cause current to flow through the load, generating electrical power.

Many thermoelectric unicouples would be combined into much larger modules, significantly reducing the constraints on the optics and allowing for larger beam waists while maintaining the high ratio of absorber area to waist area (Aa/Aw) required for an efficient optical cavity. Further description is provided in *A High-Temperature, High-Efficiency Solar Thermoelectric Generator Prototype* by M. L. Olsen et al. (Solar-PACES 2013) and *High-Temperature High-Efficiency Solar Thermoelectric Generators* by Lauryn L. Baranowski et al., Journal of Electronic Materials (2014), the entire disclosures of which are incorporated by reference herein in their entireties.

FIG. 3 is a schematic of a TEG module 30 with unicouples linked electrically in series. The TEG module 30 converts heat into electricity. Heat is absorbed 8 into a substrate 10 (the upper substrate in FIG. 3). The heat 8 is absorbed by the metal interconnects 39 (again, the upper metal interconnect in FIG. 3) and dissipates through the TE modules' legs 22, 24 to the lower metal interconnect 39 and is rejected 35 out through the lower substrate 10. The TEG module 30 includes external electrical connections 33 through which current 31 can flow out of the TEG module 30. The enlarged view of FIG. 3 shows the heat flow 37 direction and shows that each upper metal interconnect 39 is interconnected to one p-type semiconductor leg 22 and one n-type semiconductor leg 24. The p-type semiconductor leg 22 is comprised of a material that has electrical conductivity between that of a conductor (such as copper) and that of an insulator (such as glass) and has a larger hole concentration than electron concentration (i.e., "p-type" refers to the positive charge of the hole, $h^+$). The p-type semiconductor leg 22 has a hot side 32 (close to the absorber) and a cold side 34 (away from the absorber). The n-type semiconductor leg 24 is comprised of a material that has electrical conductivity between that of a conductor (such as copper) and that of an insulator (such as glass) and has a larger electron concentration than hole concentration (i.e., "n-type" refers to the negative charge of the electron, $e^-$). The n-type semiconductor leg 24 has a hot side 36 (close to the absorber) and a cold side 38 (away from the absorber).

Figure 4:
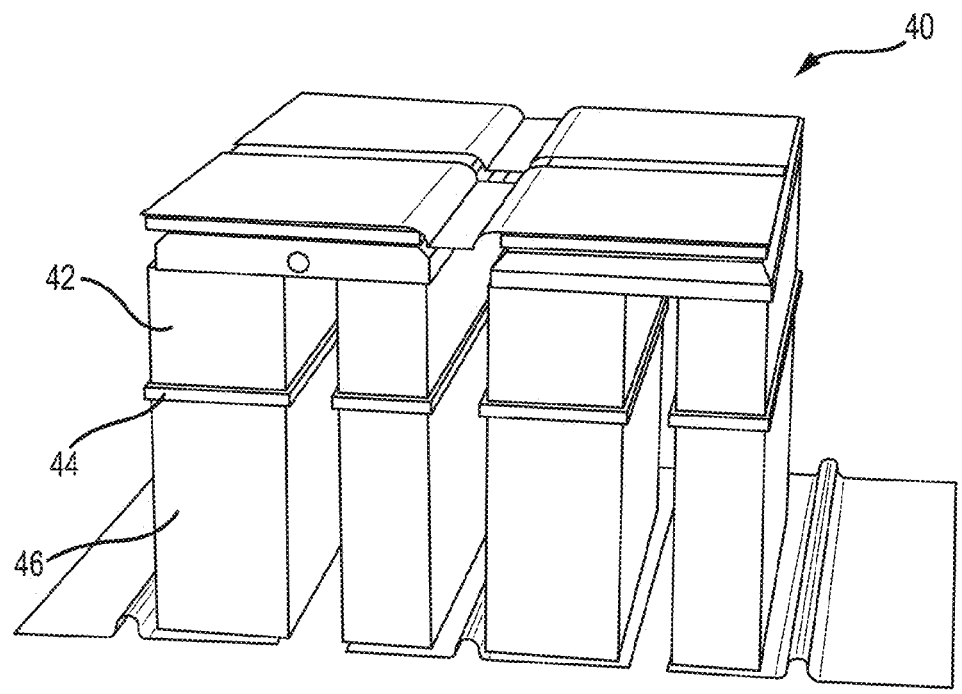
FIG. 4 is a second embodiment of a thermoelectric module.

FIG. 4 shows one embodiment of a TE module 40. The TE module 40 has hot-side TE segments 42, a compliant interface 44, and cold-side TE segments.

A multilayer selective absorber film is shown in FIG. 5. At high operating temperatures, radiation losses from the top surface can limit device performance. Selective absorbers are designed to maximize absorption of visible lights, while minimizing the emission of black body radiation. The optical properties of multilayer selective absorber films can be tuned by changing the materials and layer thicknesses. In one embodiment, films are designed and fabricated using a new class of materials, optimized for operation at 1000° C. and fabricated using physical vapor deposition.

FIGS. 6-11 show the basic principles in one embodiment of the design. Sunlight 6 is concentrated down to a focal point and the absorber is put on the far side of this focal point. A thermal cavity is constructed from the absorber up to the focal point and a pin-hole in the cavity enables the concentrated light to enter the cavity. The walls of the cavity exhibit low thermal conductivity (e.g., radiative baffling) and are at a temperature close to the absorber. The dominant radiative loss is then restricted to a narrow angular range determined by the geometry of the cavity and pin-hole. Thus, the directed nature of sunlight enables optical engineering to decrease the radiative losses significantly and thereby run a more efficient STEG with less solar concentration.

Figure 6:
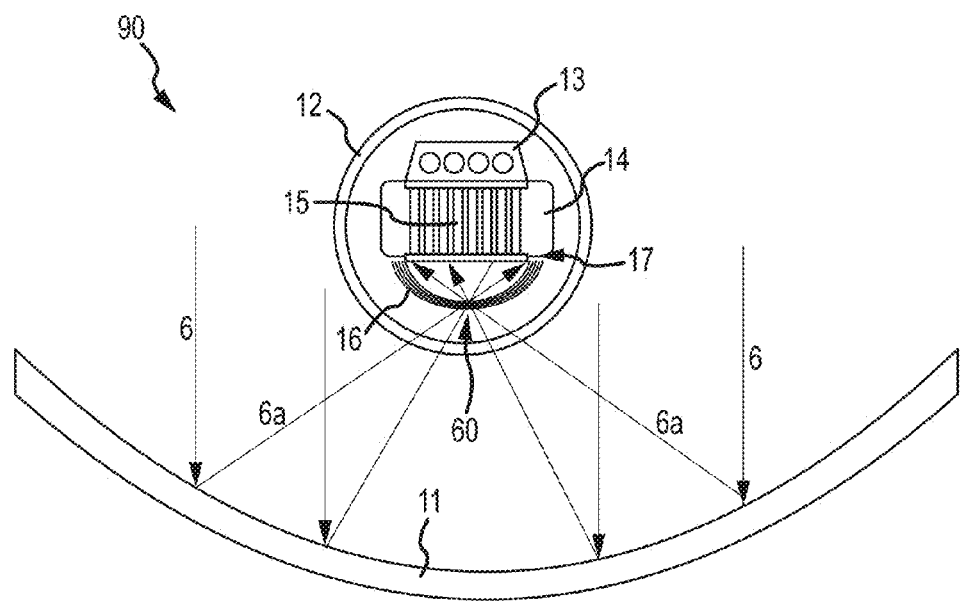
FIG. 6 is a second embodiment of a STEG with six subsystems.

FIG. 6 depicts a parabolic trough single axis system 90. The parabolic trough single axis system 90 may comprise a parabolic mirror 11 to receive sunlight 6 and focus or concentrates light 6a to a focal point 60. The STEG is housed within a vacuum tube 12 much like a solar hot water heater or similar. The back side of the STEG is actively cooled 13 with flowing fluid. Heat loss from the sides of the STEG is prevented by insulation 14 such as aerogel. The active TEG component 15 is a rectangular module. Radiation from the hot side is reflected by a set of metal foil baffles 16. These reduce the radiative loss from the absorber 17.

Figure 7:
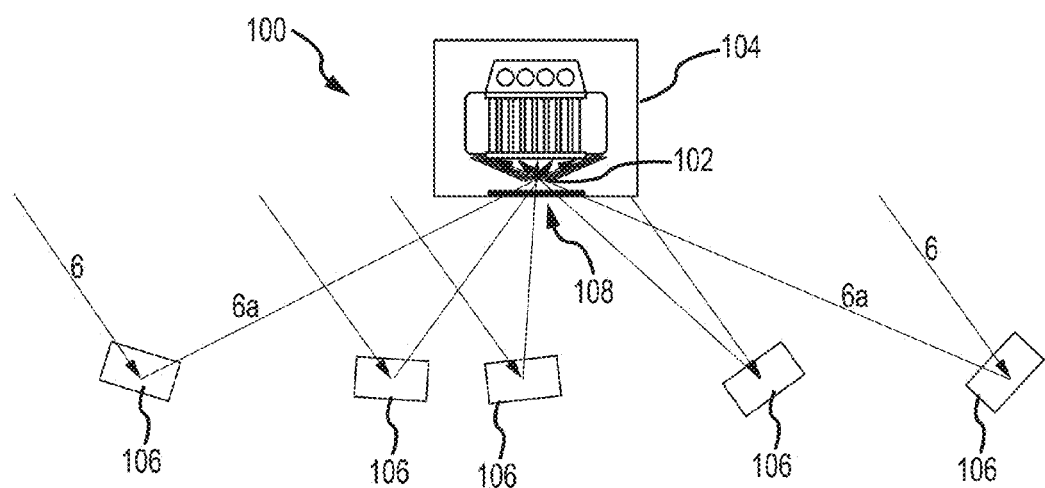
FIG. 7 is one embodiment of a heliostat with a mirror array.

FIG. 7 depicts a heliostat with a mirror array 100. While the parabolic trough of FIG. 6 has a line focus, necessitating a slit in the thermal cavity, a heliostat with a mirror array can focus the incoming light 6 to a single point (with some width). Thus, the thermal cavity in this embodiment only has a pinhole 102 to let the concentrated light 6a enter. The mirrors 106 are shown as boxes and the STEG is encased in a vacuum chamber 104 with a window 108.

Figure 8:
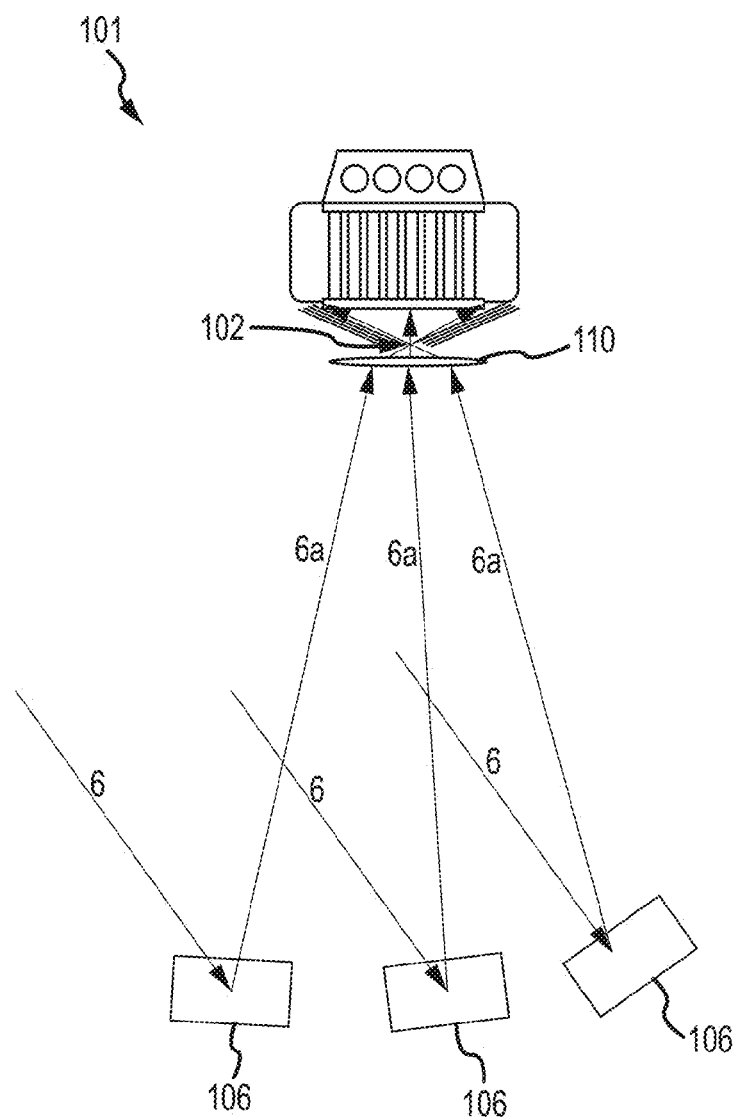
FIG. 8 shows a third embodiment of a STEG with a secondary optical system.

FIG. 8 shows a STEG with a secondary optical system 101. A secondary optic 110 (e.g., lens or mirror) can be used to change the focal length so as to evenly illuminate the absorber. This allows the dimensions of the optical cavity to be tuned. The STEG with the secondary optical system 101 may comprise mirrors 106 and a pinhole 102 to concentrate the incoming sunlight 6 onto the secondary optic 110.

Figure 9:
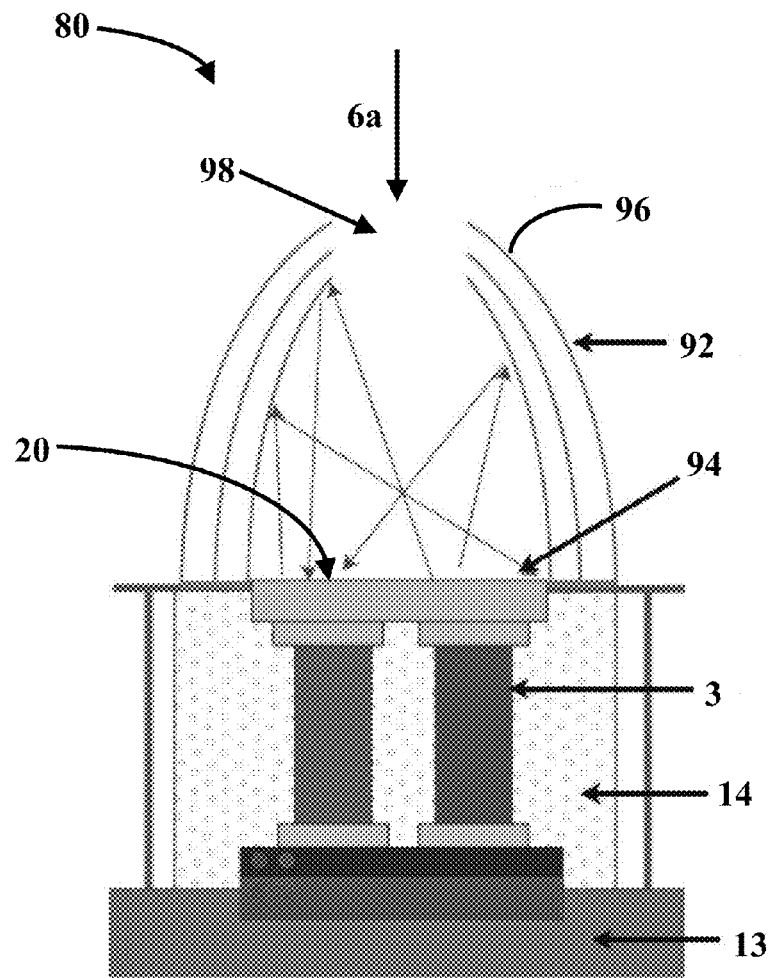
FIG. 9 is a fourth embodiment of a STEG with a cavity.

As shown in FIGS. 9 and 10, the STEG 122 also includes a non-uniform cavity 92 to physically block thermal radiation from escaping and redirect it to the absorber surface 20. In a non-uniform cavity, only one surface absorbs the incoming light, with the other surfaces reflect emitted radiation back to the active surface, which enables the achievement of high temperatures with lower levels of optical concentration. A uniform cavity requires higher levels of optical concentration to achieve the same efficiency as a non-uniform cavity. The operating principle of the cavity 92 is that concentrated sunlight 6a is focused to a waist 88 and enters through a small aperture 98 at the top of the cavity 92. The light diverges inside the cavity 92 to fully irradiate the absorber surface 94. Any sunlight that is reflected by the absorber 94 or blackbody radiation that is emitted from the absorber surface 20 is then (i) reflected by the cavity 92 (specifically by the cavity walls 96), (ii) absorbed and thermally reemitted by the cavity 92, or (iii) lost through the aperture 98. The proper choice of cavity 92 geometry can increase the probability that the reflected light 6b will be directed back toward the absorber surface 20. Using multiple layers of foil 16 for the cavity 92 improves its insulating behavior, increasing the probability that thermal radiation will be reemitted into the cavity 92 and absorbed by the device rather than lost through the walls 96. Designing the cavity 92 such that the area of the aperture 98 is much smaller than the absorber area limits the solid angle through which radiation can escape.

One embodiment of a STEG 122 that employs a state-of-the-art TEG 3 with high optical concentration (200-300 Suns at the absorber 94 surface to achieve a sunlight-generated $T_h=1000°$ C.) with a targeted total efficiency of 15% is provided and shown in FIG. 10. In addition to the efficient TEG 3, to reach the efficiency target, the novel STEG 122 requires (i) an absorber 94 that is well matched to the solar spectrum, (ii) minimal heat losses due to thermal radiation, (iii) a vacuum 5 environment to eliminate convective heat losses and prevent degradation of the STEG 1222, and (iv) an additional, actively cooled $Bi_2Te_3$ thermoelectric stage 86, which is expected to increase the total TEG efficiency to 18% by allowing for a lower $T_c$. To simultaneously meet requirements (i) and (ii), a solar-selective absorber 94 will be coupled with a thermally insulating cavity 92. The STEG 122 further includes a stand 80 and feed-throughs 82 for stage control, electronics, and cooling. The vacuum chamber 5 can include a port 84, which may be a lens or a window, to allow light 6a into the chamber 5. In one embodiment, the port 84 includes a water-cooled quartz window. An embodiment of this design is shown in FIG. 10.

Figure 11C:
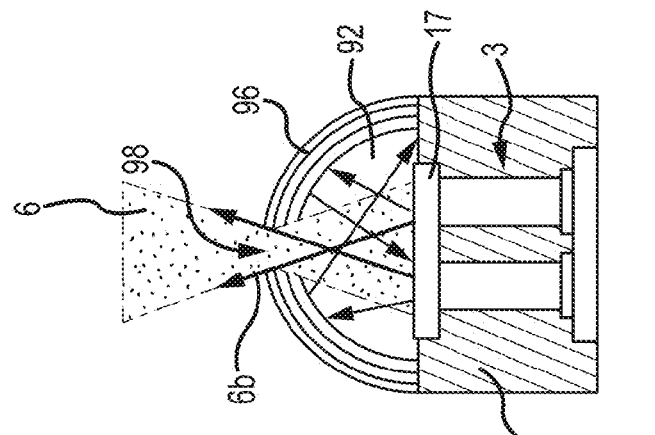
FIGS. 11A-C show various embodiments of a STEG.
Figure 11B:
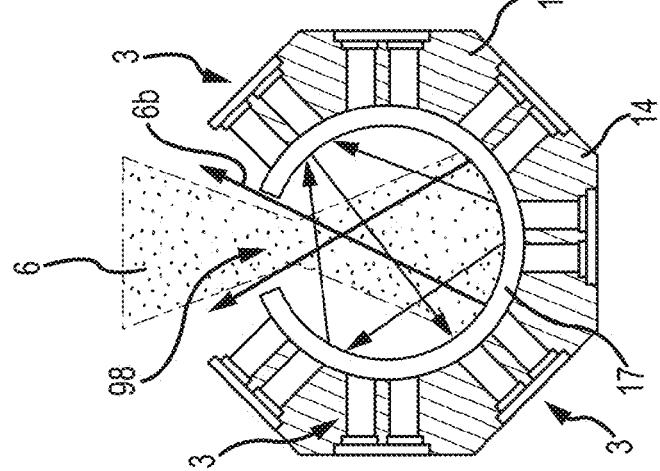
Figure 11A:
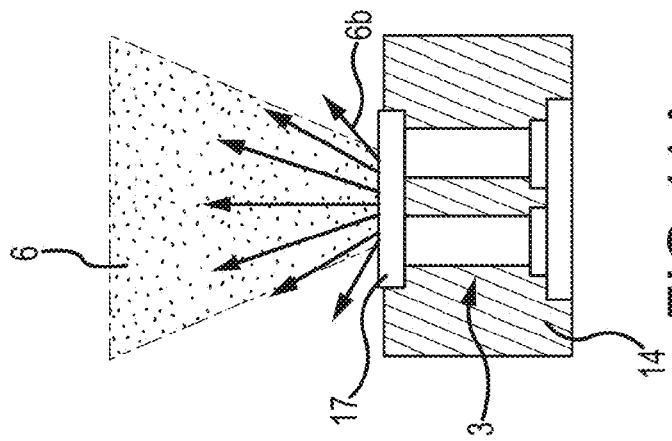

FIGS. 11A-C show different embodiments of the STEG. FIG. 11A shows a STEG with no enclosure or cavity to limit radiative losses from reflected or radiated light 6b. The STEG includes a flat-plate absorber 17 to absorb the concentrated sunlight 6a, a TE module 3, and insulation 14. FIG. 11B is a STEG with a round cavity formed by the TE modules 3 positioned in a circular shape. Concentrated sunlight 6a can enter the cavity through an aperture 98 in the cavity. The shape of the cavity and the aperture 98 limit the amount of reflected or radiated light 6b that can leave the cavity, i.e., not be absorbed by the absorber 17. The STEG further includes insulation 14 to prevent heat from escaping the system. FIG. 11C shows a STEG with a TE module 3 and a dome-shaped cavity 92 with non-uniform walls 96. Concentrated sunlight 6a can enter the cavity 92 through an aperture 98 in the cavity 92. The shape of the cavity 92 and the aperture 98 limit the amount of reflected or radiated light 6b that can leave the cavity 92, i.e., not be absorbed by the absorber 17. The STEG further includes insulation 14 to prevent heat from escaping the system.

Figure 12:
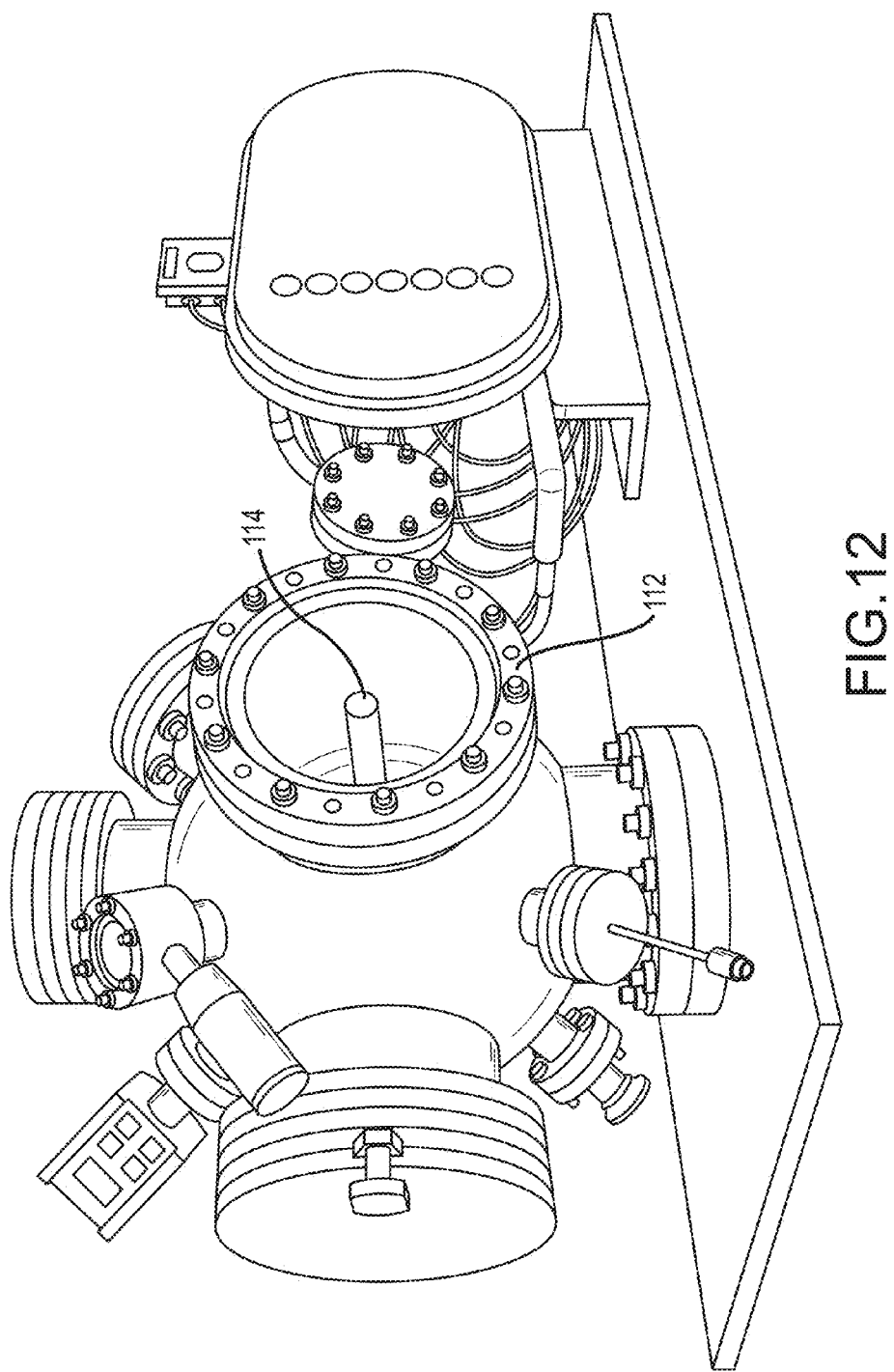
FIG. 12 is an experimental chamber for a STEG and a flux mapping plate.

FIG. 12 shows an experimental chamber and flux mapping plate for imaging and calorimetry. The chamber can be a vacuum chamber with an optical port 112 (i.e., a port with secondary optics) to allow light from a high flux solar furnace to enter the chamber. The STEG is positioned within the chamber and is not visible in FIG. 12. The chamber further includes a post 114 on which the stage can be mounted.

Figure 13:
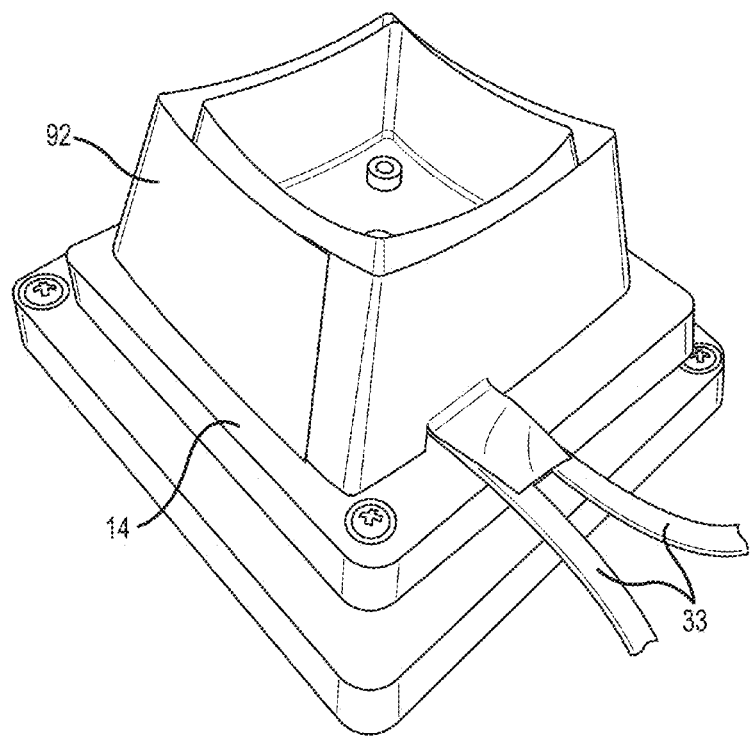
FIG. 13 is one embodiment of a TEG with a dual-wall thermal and optical.

FIG. 13 shows one embodiment of a TEG with a dual-wall thermal and optical cavity 92 (comprised of foil) on top of white thermal insulation 13. The TEG also includes electrical leads or external electrical connections 33.

Figures 14A, 14B:
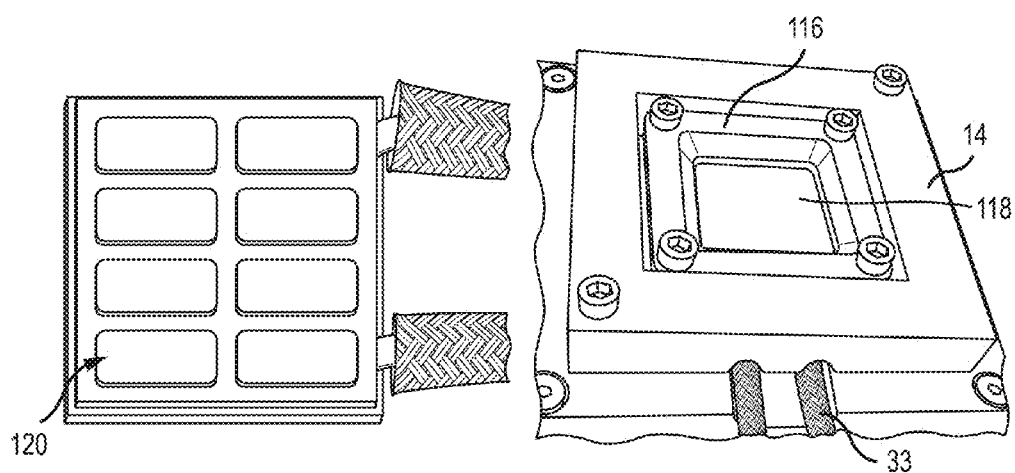
FIG. 14A shows the pads 120 of the thermoelectric module.
FIG. 14B is a second embodiment of a selective absorber.

FIG. 14A shows the pads 120 of the thermoelectric module, which are positioned below the optical cavity 92 shown in FIG. 13 and below the selective absorber shown in FIG. 14B. The pads 120 provide thermal contact to the proximate components. Thus, the thermoelectric generator is positioned within the white insulation 14 shown in FIGS. 13 and 14B.

FIG. 14B shows one embodiment of a selective absorber. The selective absorber is surrounded by insulation 14 and has a film 118 to increase absorption and reduce reflection and radiation. A compression plate 116 is used to connect the selective absorber to the TEG. The electrical leads 33 from the TEG can also be seen in FIG. 14B.

Figure 15A:
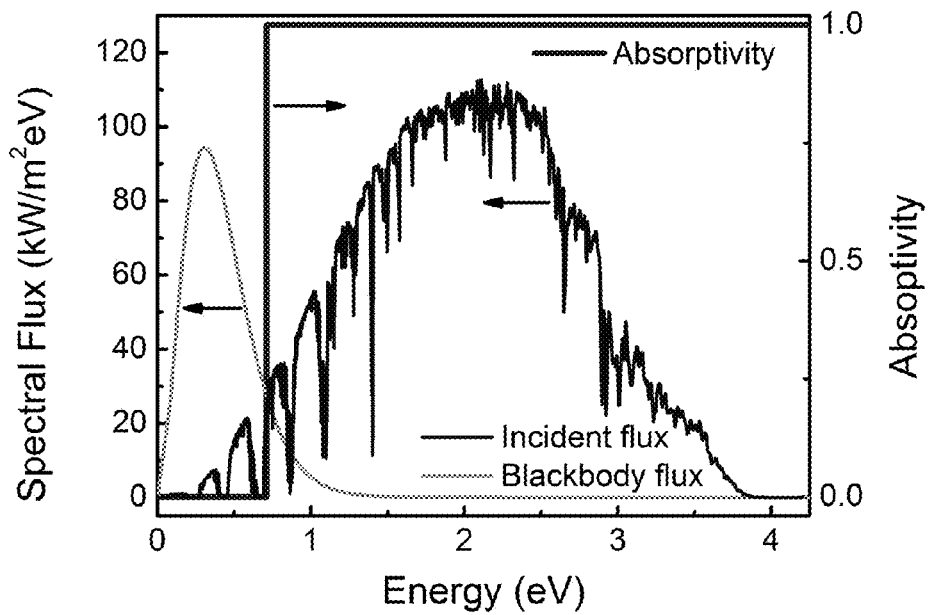
FIGS. 15A-B are graphs of the incident solar flux and the black body emission spectrum peak at different energies.
Figure 15B:
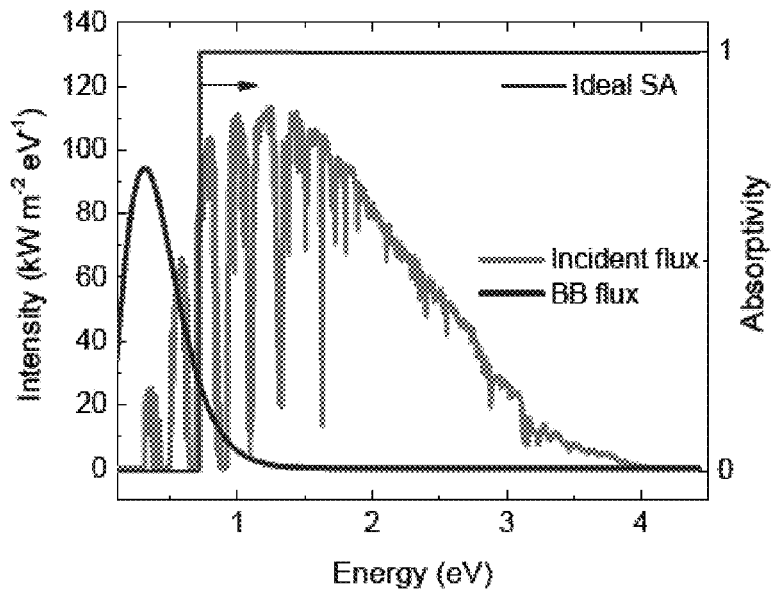

As can be seen in FIGS. 15A and 15B, the incident solar flux and the black body emission spectrum peak at different energies. In an ideal selective absorber, the absorptivity takes the form of a step function, in which the step from zero to one is located between the black body and solar flux maxima. The location of the step-edge is referred to as the cutoff energy. This optimum cutoff energy is function of both temperature and optical concentration. A selective absorber can be used to maximize the flux absorbed and minimize the flux re-radiated to the atmosphere. Here, the optimized energy cutoff is shown for a direct incident flux of 200 $kW/m^2$ and a black body temperature of 1000° C. FIGS. 15A and 15B show that even with an ideally selective absorber (which is far from currently achievable), the absorber efficiency at 1000° C. is only 80%.

Materials such as semiconductors are often considered intrinsic absorbers, meaning that they exhibit some solar selectivity as pure materials. For a semiconductor, the cutoff value between high and low absorptivities is determined by the bandgap of the material. In recent years, intrinsic absorbers have been used as the starting materials for high performing selective absorbers, ranging from simple layered designs to highly sophisticated plasmonic and photonic structures. High temperature absorbers (above 750° C.) have been developed that exhibit solar absorptivities above 0.8 and thermal emissivities below 0.15.

Figure 16:
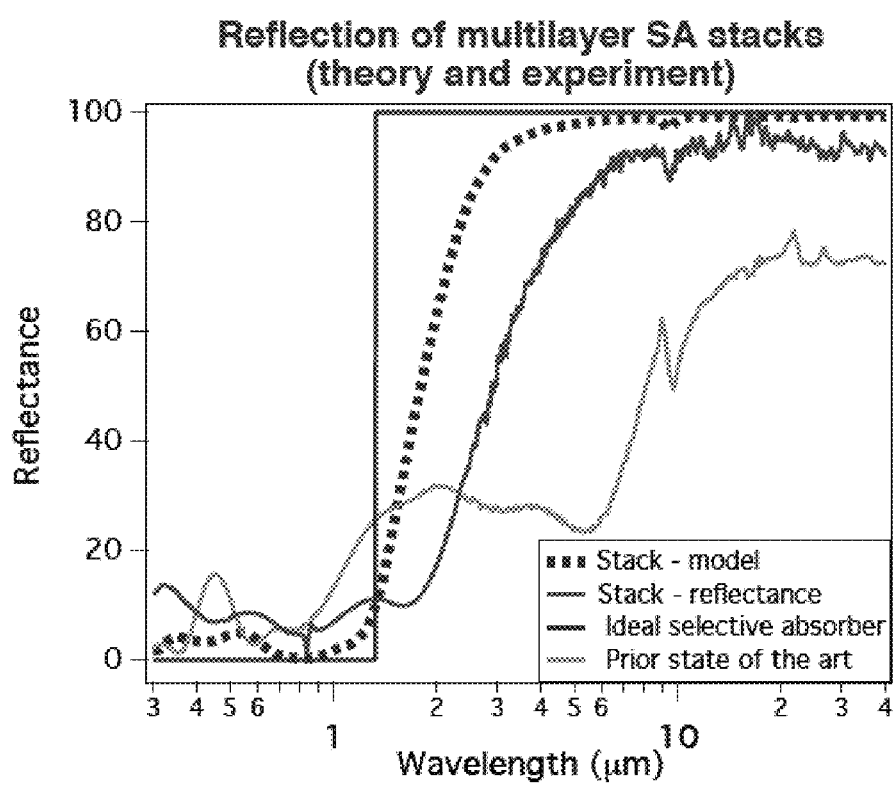
FIG. 16 is a graph showing the reflection of multilayer selective absorber stacks across different wavelengths.

FIG. 16 is a graph showing the reflection of multilayer selective absorber stacks across different wavelengths. One line (the straight line) shows the reflectance for the ideal selective absorber. The dotted line shows the reflectance for the model. The darker line shows the reflectance for the ideal selective absorber. The lighter lines shows the reflectance for selective absorbers of the prior art.

Figure 17:
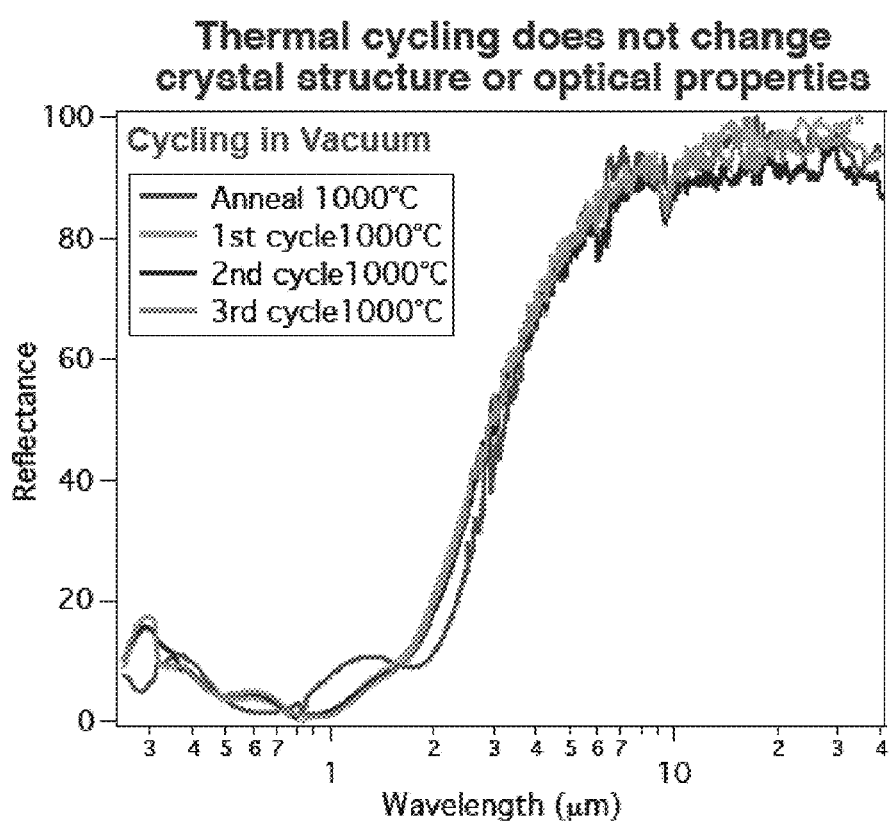
FIG. 17 is a graph showing the reflection over different light wavelengths for each cycle.

FIG. 17 is a graph showing the reflection over different light wavelengths for each cycle. The reflectance is about the same for each cycle; therefore thermal cycling does not change the crystal structure or optical properties of the selective absorber.

Figure 18:
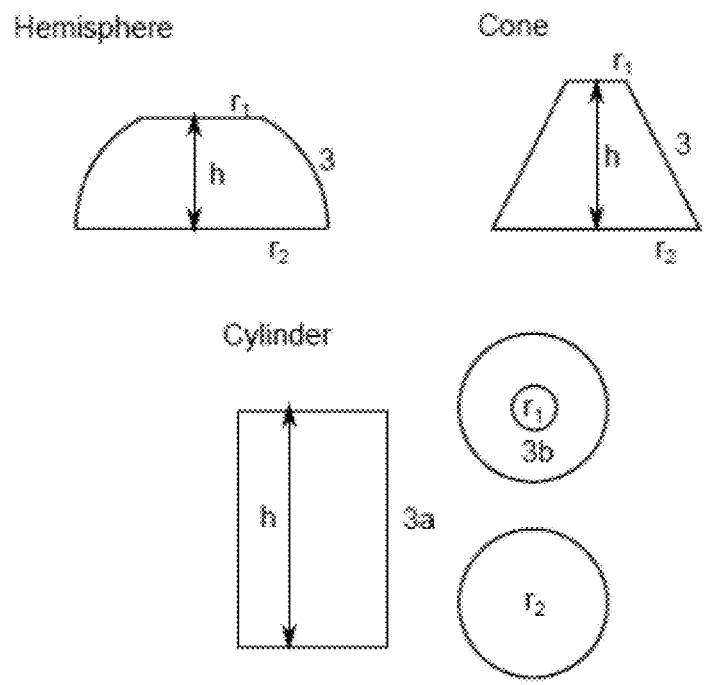
FIG. 18 shows three different radiation shields shapes.

FIG. 18 shows three shapes for the proposed radiation shields: a cylinder, a cone, and a hemisphere. The three surfaces participating in radiation exchange are defined with each other. In each configuration, an aperture allows light to enter the cavity: this is defined as surface 1.

The absorber surface at the base of the cavity is defined as surface 2. The inner walls of the radiation shield are defined as surface 3 (in the cylinder this is split up into 3a and 3b for calculation reasons). For the cylinder and the cone, we have three free parameters: $r_1$, $r_2$, and h. The value of h for the hemisphere is not a free parameter, but rather is dictated by $r_1$ and $r_2$. In the following analysis, we consider the ratio of r2 to r1, rather than their individual values. Similarly, we write h values as multiples of $r_1$.

Figure 19:
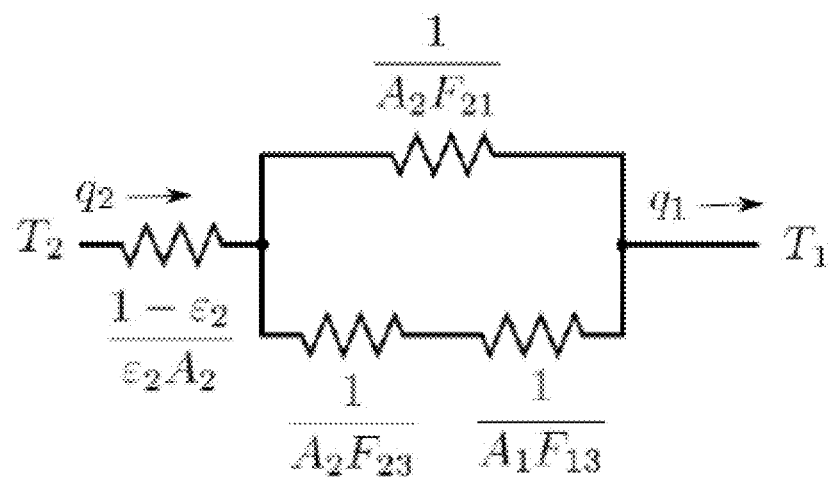
FIG. 19 is a thermal circuit model.

FIG. 19 depicts a thermal circuit model. Several assumptions can be made to simplify the problem. Assumption 1 is that the radiation shield (surface 3) is what is called a "reradiating surface." This is a surface that has zero net radiation transfer; in real life it is closely approached when convection effects can be neglected on the radiating surface, and the other surface is well insulated. Assumption 2 is that we model the aperture (surface 1) as a black body at the temperature of the surroundings. Lastly, we assume that the absorber (surface 2)

is a gray or black body, meaning that the absorptivity/emissivity of the surface is not wavelength dependent.

These assumptions allow us to draw the thermal circuit model shown in FIG. 19. There are two kinds of resistances modeled in this circuit. The first resistor on the left, for surface 2, is the resistance to heat loss through radiation. As can be seen from the equation, as surface 2 approaches a black body ($\epsilon_2$ approaches 1), this resistance becomes zero (note that there is no analogous resistor for surface 1, because we already assumed this surface to be a black body). The other resistances shown in the circuit are geometry dependent factors. These depend on both the area of each surface and the view factor between the surfaces. View factors are written as $F_{xy}$, denoting the view factor from surface x to surface y. For common geometries, such as those in FIG. 18, analytic expressions to calculate view factors are readily available.

Figure 20:
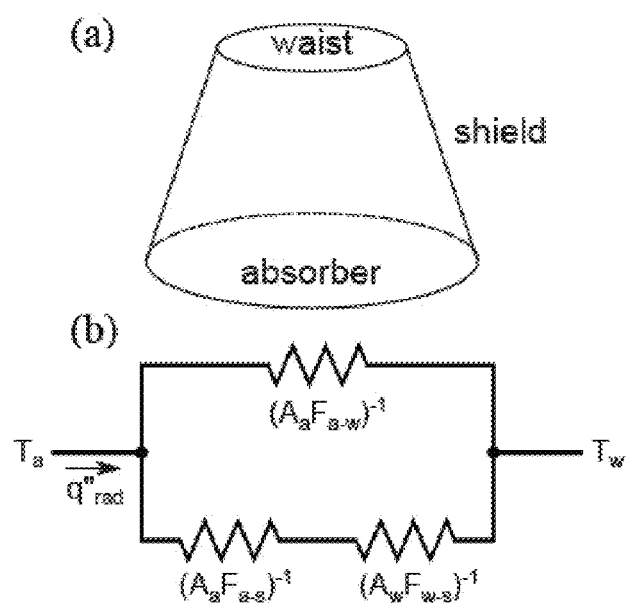
FIG. 20(a) shows solar radiation focused to a waist where it enters the cavity and heats the absorber surface.
FIG. 20(b) is the physical model translated into a thermal circuit model.

FIGS. 20(*a*)-(*b*) show the thermal/optical cavity modeling approach. A thermal circuit model can be used to optimize the geometry of the cavity. FIG. 20(*a*) shows a simplified single layer, perfectly insulating cavity in the form of a truncated cone. The absorber is assumed to have unity absorption across all wavelengths. Both the aperture and absorber are modeled as blackbody emitters at different temperatures, while the inner surface of the shield is assumed to be opaque, diffuse, and at constant temperature. The physical model of the cavity is translated to a thermal circuit as shown in FIG. 20*b* with the cavity creating resistance to heat loss from the absorber, which depends on the surface area and view factor of each component. Achieving the 15% efficiency goal requires an absorber efficiency of 85% (i.e. ηTE.*ηabs=0.18× 0.85=0.15), which can be reached with concentration at the absorber <300 Suns. Through this thermal model, the physical parameters of the cavity are optimized including shape, number of insulating layers, and the ratio of the aperture radius to the absorber radius, which defines the required convergence angle of the incoming sunlight. FIG. 20(*a*) shows solar radiation focused to a waist where it enters the cavity and heats the absorber surface. The shield serves to limit the solid angle over which radiative losses can occur. FIG. 20(*b*) shows that the physical model can be translated to a thermal circuit model where $T_w$ and $T_a$ are the temperatures of the blackbody emitters at the waist and absorber surface, respectively. The resistances to heat loss ($q''_{rad}$) in the system depend on the surface areas of the components ($A_i$) and the geometric view factors ($F_{i-j}$).

The above resistances can be combined to determine a total system resistance R:

$$R = \frac{1-\epsilon_1}{\epsilon_2 A_2} + \left(A_2 F_{21} + \frac{1}{(A_2 F_{23})^{-1} + (A_1 F_{13})^{-1}}\right)^{-1} \quad (2)$$

Then, we use this resistance to write an expression for $q_2$:

$$q_2 = \frac{\sigma T_2^4 - \sigma T_1^4}{R} \quad (3)$$

Here, the terms in the numerator are the result of integrating the black body emission spectrum over all wavelengths.

Recall that the absorber efficiency was defined as:

$$\eta_{abs} = \frac{q_{abs} - q_{rad}}{q_{inc}} \quad (4)$$

Because we assumed that the absorber surface was a gray or black body, the heat absorbed can simply be written as:

$$q_{abs} = \epsilon_2 q_{inc} \quad (5)$$

This allows us to simplify the absorber efficiency:

$$\eta_{abs} = \epsilon_2 - \frac{q_{rad}}{q_{inc}} \quad (6)$$

Using the u=s model for a constant zT, the STEG efficiency can be written as:

$$\eta_{STEG} = \eta_{abs}\eta_{TE} = \frac{q_{abs} - q_{rad}}{q_{inc}}\left(1 - \left(\frac{T_c}{T_h}\right)^{\eta_r}\right) \quad (7)$$

Or, using Eq. (6), $$\eta_{STEG} = \eta_{abs}\eta_{TE} = \left(\epsilon_2 - \frac{q_{rad}}{q_{inc}}\right)\left(1 - \left(\frac{T_c}{T_h}\right)^{\eta_r}\right) \quad (8)$$

Eq. (8) immediately allows us to examine the limiting case in which $q_{rad}$ approaches zero. We see that $\eta_{abs}=\epsilon_2$, giving an expression for the maximum STEG efficiency:

$$\eta_{STEG,max} = \epsilon_2\left(1 - \left(\frac{T_c}{T_h}\right)^{\eta_r}\right) \quad (9)$$

Provided that radiation losses can be sufficiently minimized, Eq. (9) makes it clear that using a black body ($\epsilon_2=1$) as the absorber surface will yield the highest STEG efficiency. Also interesting to note is that $q_{inc}$ is not present in the equation, leaving a STEG efficiency that depends only on the absorber emissivity and the TE properties. Note, a black body is better than a gray body. A wavelength dependent selective absorber will be the model built next.

We model with a STEG with a hot side temperature ($T_h$) of 1273 K, a cold side temperature ($T_c$) of 300 K, and a zT of 1. As discussed above, we assume that the absorber surface is a black body ($\epsilon_2=1$). We plot the STEG efficiency as a function of the ratio of the absorber ($r_2$) to aperture ($r_1$) radii. For the cylinder and the cone, two outer bounds on the value of h are used: $h=r_1$ (lower bound) and $h=r_1*10^3$ (upper bound).

As predicted by Eq. (9), as the radiative losses approach zero, the STEG efficiency asymptotes to a maximum value. Additionally, this maximum efficiency is not dependent on the value of $q_{inc}$: the efficiency curves in FIG. 21 ($q_{inc}=100$ kW/m$^2$) and FIG. 22 ($q_{inc}=200$ kW/m$^2$) asymptote to the same value. Thus, the incident flux has no effect on the STEG efficiency when $r_2/r_1>10$.

Regardless of the shape of the cavity, the maximum efficiency can be obtained when $r_2/r_1>10$. This indicates that radiative losses are effectively eliminated when the absorber radius is more than 10× the aperture radius.

Figure 23:
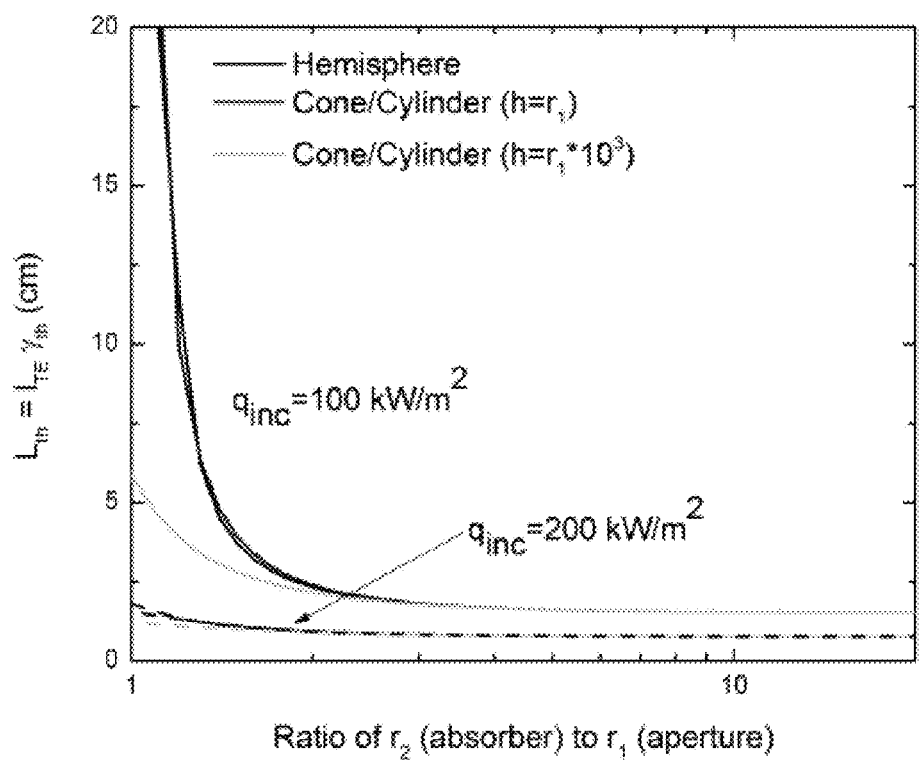
FIG. 23 plots the thermal length in centimeters as a function of $r_2/r_1$.

We can also explore the effect of radiation shielding on the thermal length of the TEG. The thermal length ($L_{th}$) is defined as the product of the TE leg length ($l_{TE}$) and the thermal concentration ($\gamma_{th}$). The thermal concentration is given by the ratio of the absorber ($A_{abs}$) to TE ($A_{TE}$) areas. For the STEG parameters given in the previous section, we plot the thermal length in centimeters as a function of $r_2/r_1$ in FIG. 23.

We see that the thermal length behaves similarly to the STEG efficiency, in that the shape and h value of the cavity are not important for $r_2/r_1>10$. The thermal length drops as $r_2/r_1$ increases, which is a result of decreasing the radiative losses. This results in an overall greater heat flux into the TE, and so the TE is required to be less thermally resistive (smaller $L_{th}$) to maintain a given value of $T_h$. For the same reason, increasing the incident flux results in a smaller thermal length.

Figure 21:
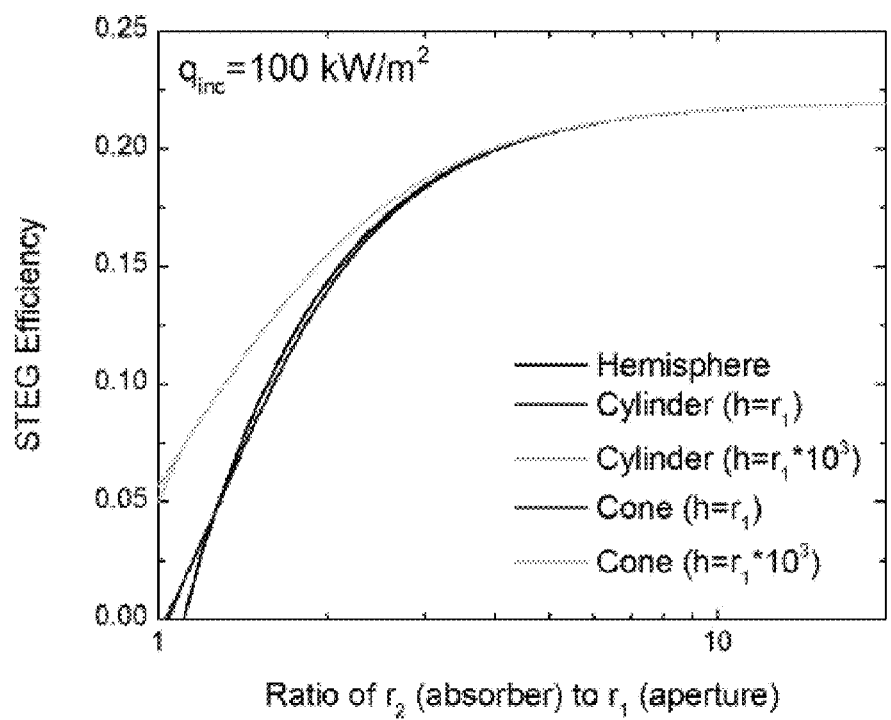
FIG. 21 is a graph of the efficiency curves with $q_{inc}=100$ kW/m$^2$.
Figure 22:
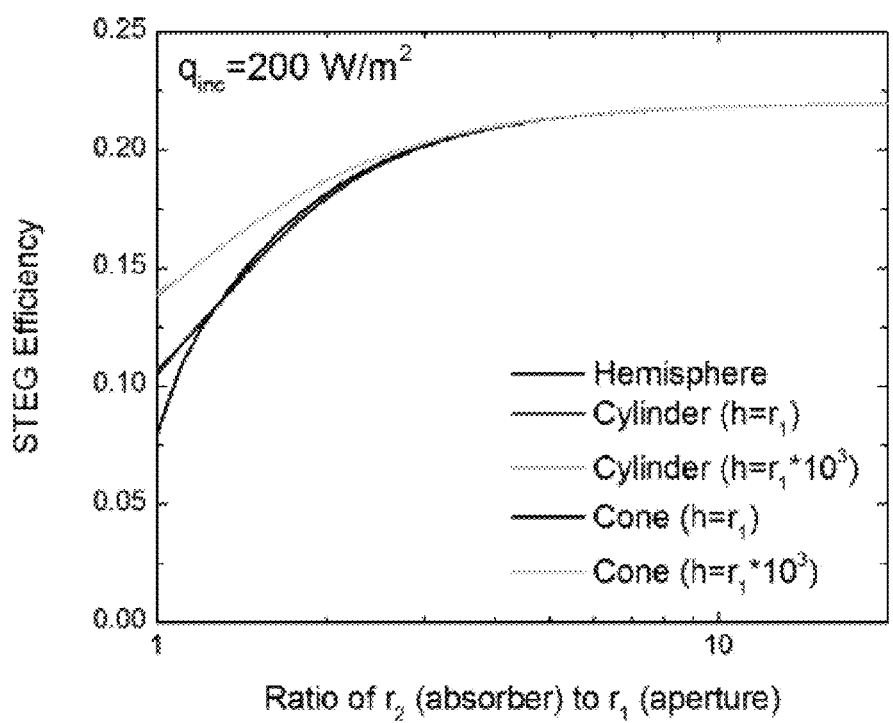
FIG. 22 is a graph of the efficiency curves with $q_{inc}$=200 kW/m².

At $r_2/r_1=10$, the thermal length values for incident fluxes of 100 kW/m$^2$ and 200 kW/m$^2$ are 1.54 cm and 0.76 cm, respectively. In the STEG without radiation shielding, increasing STEG efficiency required moving to higher incident fluxes. This created a problem, in that the thermal lengths dictated by these fluxes were often less than a reasonable value for the TE leg length (such that $\gamma_{th}<1$). As shown in FIGS. 21 and 22, the incident flux has no effect on the STEG efficiency when $r_2/r_1>10$. Thus, it is possible to use the more reasonable value of 1.54 cm at 100 kW/m$^2$, without sacrificing device efficiency.

If a lens or mirror is used to bring the focus into a point, the cavity should be constructed with a pinhole at the focal point. A linear focusing mirror (such as a trough) or lenses may be used, with the pinhole replaced by a slit at the focal line.

Thermal properties of cavity walls: The cavity walls must be thermally insulating. One embodiment is with thermal baffling, which can be used to reduce the radiative transfer. Embedding the thermal cavity within a vacuum will reduce convective losses.

The cavity should be designed with a form factor to minimize the radiation from the cavity walls to the pinhole/slit. However, any geometry is better than not having a thermal cavity. For a pin-hole focus, a cylinder with the pinhole on one flat end and the absorber on the other is a simile geometry which will serve this purpose. For the slit focus, one geometry is a hemi-cylinder with the slit running along the axis of the hemi-cylinder (thereby creating two 'quarter cylinders')

The surface properties of the cavity and absorber can be textured or coated with a photonic structure to provide angularly resolved emission properties. The over-riding goals for the absorber are to (a) absorb the incident concentrated solar flux, (b) emit little in the blackbody energy regime and (c) minimize emission away from the pinhole/slit. The goals of (a) and (b) are in conflict and an optimized selective absorber will strike a compromise between this emission and absorption. To minimize emission away from the slit, a textured or photonic structure on the absorber would be beneficial. Considering the walls of the thermal cavity, the main goal is to reduce emission from the walls to the pinhole/slit. The photons leaving from this process are purely a loss mechanism. Along with the geometry of the thermal cavity, an angularly-resolved surface coating can be used to minimize this loss mechanism.

We can also explore the effect of radiation shielding on the thermal length of the TEG. The thermal length ($L_{th}$) is defined as the product of the TE leg length ($l_{TE}$) and the thermal concentration ($\gamma_{th}$). The thermal concentration is given by the ratio of the absorber ($A_{abs}$) to TE ($A_{TE}$) areas. For the STEG parameters given in the previous section, we plot the thermal length in cm as a function of $r_2/r_1$ in FIG. 23.

Figure 24:
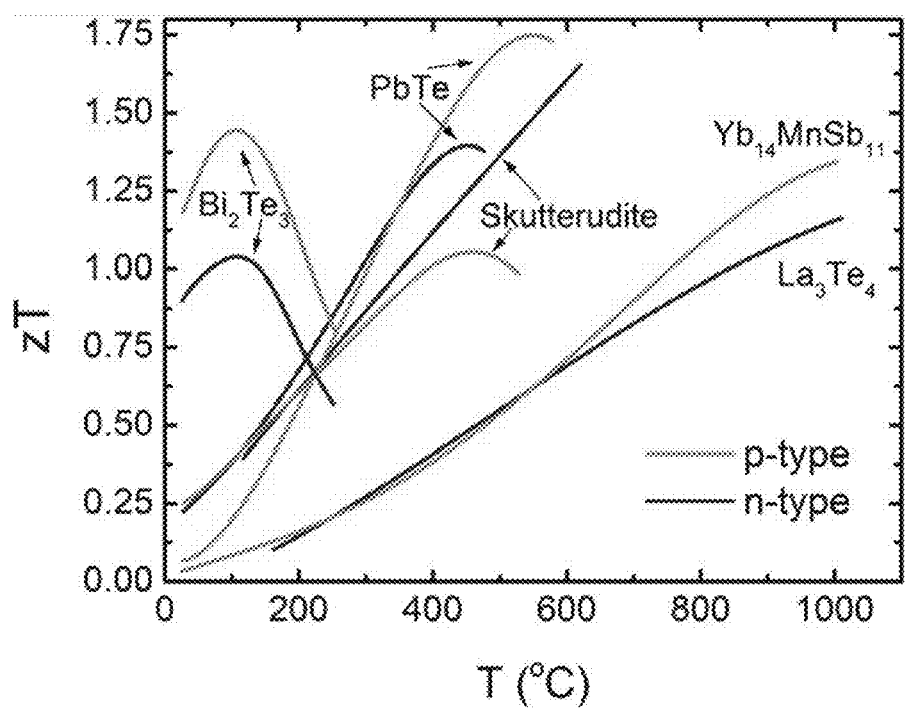
FIG. 24 shows advanced materials that exhibit zT values well in excess of unity over a broad range of temperatures.

FIG. 24 shows advanced materials that exhibit zT values well in excess of unity over a broad range of temperatures. These high performing materials have led to a record of 15% unicouple efficiency reported by the Jet Propulsion Laboratory in 2012. FIG. 24 shows advanced thermoelectric materials demonstrate zT values well above 1, for both N- and P-type materials. This represents a distinct improvement over traditional materials, which possess peak zT values between 0.5 and 0.8.

The N- and P-type material may be a semiconductor, i.e., a material that has electrical conductivity between that of a conductor (such as copper) and that of an insulator (such as glass). Typically, N-type semiconductors have a larger electron concentration than hole concentration. The phrase "n-type" comes from the negative charge of the electron. In N-type semiconductors, electrons are the majority carriers and holes are the minority carriers. N-type semiconductors are created by doping an intrinsic semiconductor with donor impurities (or doping a P-type semiconductor as done in the making of CMOS chips). A common dopant for N-type semiconductors is phosphorus. In an N-type semiconductor, the Fermi energy level is greater than that of the intrinsic semiconductor and lies closer to the conduction band than the valence band. As opposed to N-type semiconductors, P-type semiconductors have a larger hole concentration than electron concentration. The phrase "p-type" refers to the positive charge of the hole. In P-type semiconductors, holes are the majority carriers and electrons are the minority carriers. P-type semiconductors are created by doping an intrinsic semiconductor with acceptor impurities (or doping an N-type semiconductor). A common P-type dopant is Boron. P-type semiconductors have Fermi energy levels below the intrinsic Fermi energy level. The Fermi energy level lies closer to the valence band than the conduction band in a P-type semiconductor.

In deriving the total system efficiency, we separate the optical efficiency from the STEG efficiency. The STEG can be broken down into two subsystems: the thermal absorber and the TEG. The efficiency for each subsystem can be derived individually, and the STEG efficiency is simply the product of the two. The absorber efficiency is defined as the ratio of the heat transferred to the TE to the total heat that strikes the absorber surface. We must first consider the modeling of the selective absorber to determine how much of this incident heat is actually absorbed by the surface. Then, the absorber efficiency is derived using heat transfer modeling to consider the conductive and radiative heat flows within the absorber and the TE leg. The thermoelectric efficiency is derived for model materials with a temperature independent zT and for real materials in a cascaded generator.

Figure 25:
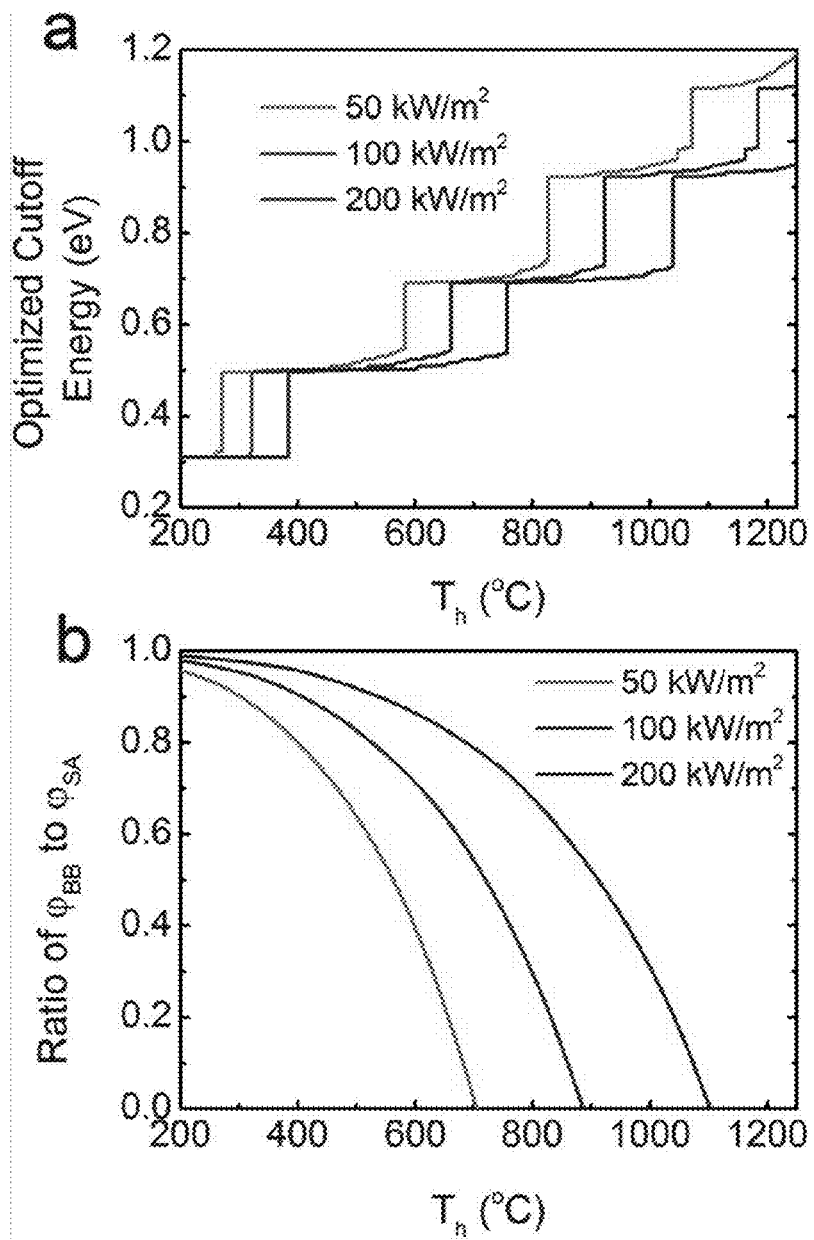
FIG. 25(a) shows the cutoff energy for a selective absorber.
FIG. 25(b) compares the ratio of the net flux achieved by the black with an optimized selective absorber.

FIG. 25(a) shows the cutoff energy for a selective absorber must be optimized with respect to both temperature and optical concentration to achieve the maximum net flux into the absorber. In a selective absorber, the absorption cutoff is positioned to maximize the energy absorbed and minimize the radiative losses (shown in FIG. 15A). The results of the selective absorber optimization performed here are shown in FIG. 25(a). With an increase in temperature, the black body emission spectrum shifts to higher energies. To avoid high radiative losses in this situation, the cutoff also shifts to higher energy values. Conversely, as the incident solar flux increases, the magnitude of this incident flux becomes much larger than the black body emission curve. This moves the cutoff to lower energies, so as to absorb more of the concentrated solar flux. In all curves, we see sharp jumps in the energy cutoff values, which can be explained by considering the water absorption bands in the AM 1.5 spectrum (see FIG. 15A). Because the incident flux is much lower within these bands, the total flux is decreased when the cutoff is positioned within an absorption band. The optimized cutoff will remain at an energy just below the absorption band, even as the temperature increases and the black body emission spectrum shifts to high energies, until it becomes advantageous for the cutoff to "jump" to the other side of the absorption band.

Because the use of a selective absorber increases both the cost and complexity of the STEG, one could also consider using a black body as the thermal absorber. FIG. 25(b) shows the net flux for a black body absorber ($\phi_{BB}$) versus the net flux for an optimized selective absorber ($\phi_{SA}$), the performance of the selective absorber is markedly better at high temperatures and low incident fluxes. FIG. 25(b) compares the ratio of the net flux achieved by the black body ($\phi_{BB}=q''_{abs}-q''_{rad}$) to the net flux achieved with an optimized selective absorber ($\phi_{SA}$). The difference between the black body and selective absorber fluxes is greatest at high temperatures and low incident fluxes. Because the radiative losses of the system show a $T_h^4$ dependence, the selective absorber is necessary to prevent large radiative losses at high temperatures. At low incident fluxes, the magnitudes of the incident and radiative fluxes are similar, and again a selective absorber is necessary to prevent large radiative losses. In contrast, at high incident fluxes the magnitude of the incident flux dwarfs that of the radiative flux, and the difference between the black body and selective absorber is less pronounced.

Figure 26:
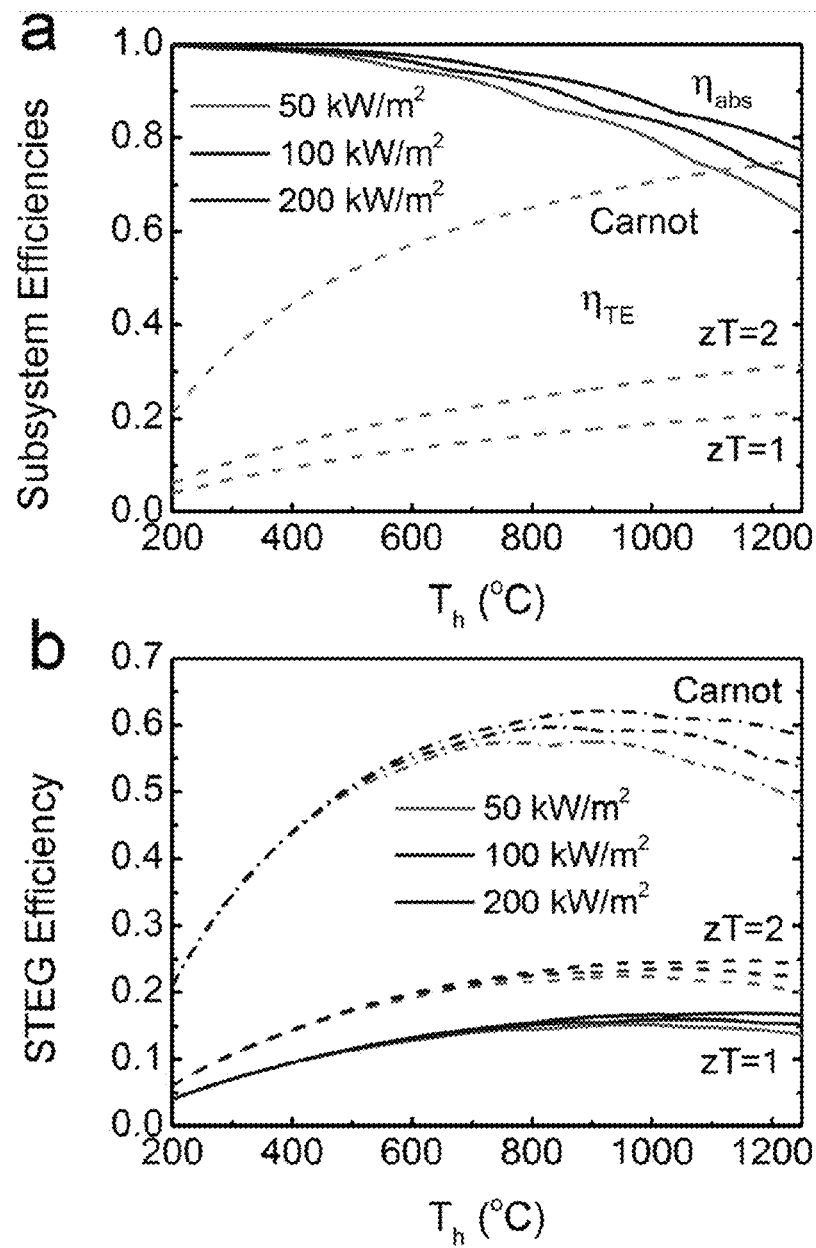
FIG. 26(a) shows the thermoelectric and absorber subsystem efficiencies.
FIG. 26(b) shows the STEG efficiency.

FIG. 26(a) shows the thermoelectric and absorber subsystem efficiencies, showing opposing trends with temperature. FIG. 26(b) shows the STEG efficiency, which is the product of the thermoelectric and absorber efficiencies.

Figure 27:
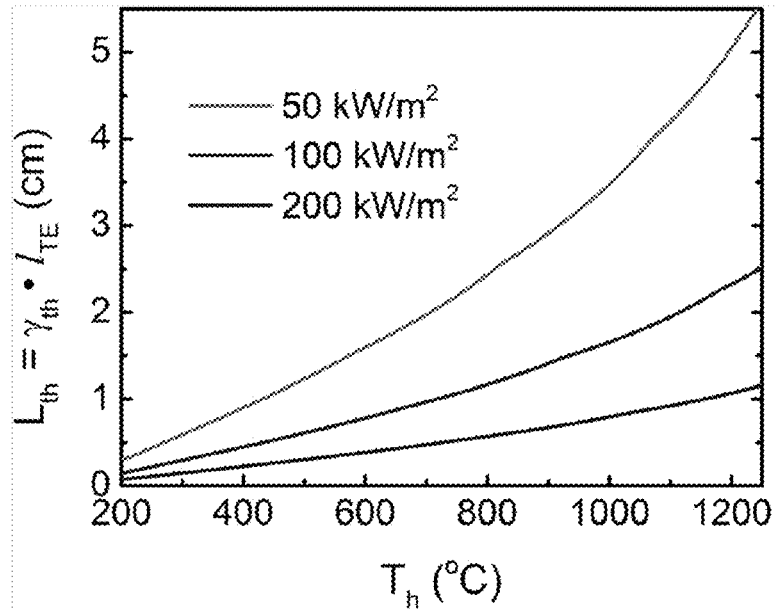
FIG. 27 shows the $L_{th}$ value of the system.

FIG. 27 shows the $L_{th}$ value of the system, representing the thermal resistance of the TE element, increases with temperature. At lower incident fluxes, the TE must be more thermally resistive (higher $L_{th}$) to maintain a given value of $T_h$ (shown for zT=1).

Figure 28:
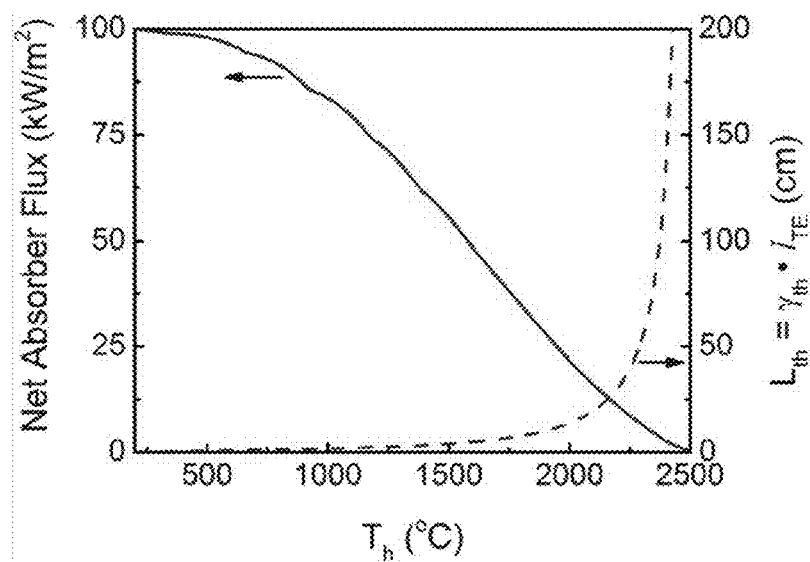
FIG. 28 graphs the net absorber flux for various hot side temperatures.

FIG. 28 shows that for a given incident flux, there is a maximum hot side temperature that the system can achieve. No heat can flow to the TE in this situation, because the thermal resistance ($l_{th}$) of the TE leg is infinite. At this temperature, the absorber efficiency (and thus the STEG efficiency) is zero (shown for $q''_{inc}=100$ kWm$^{-2}$ and zT=1).

Figure 29:
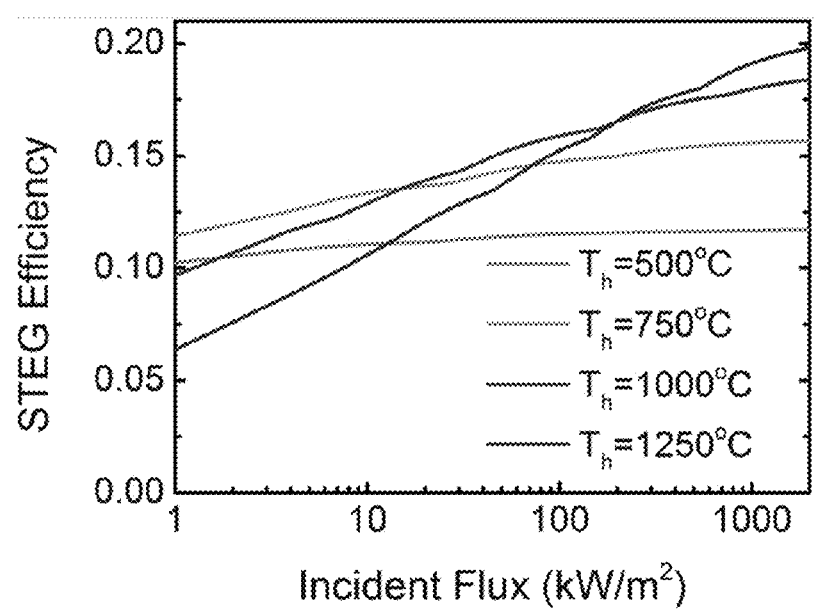
FIG. 29 is a graph plotting the STEG efficiency for various the incident fluxes at different hot side temperatures.

FIG. 29 shows that when $T_h$ is fixed and the incident flux is increased, the STEG efficiency will asymptote to a particular value. This asymptotic behavior is due to the increased magnitude of the incident flux as compared to the fixed value of the radiative flux (shown for zT=1).

Figure 30:
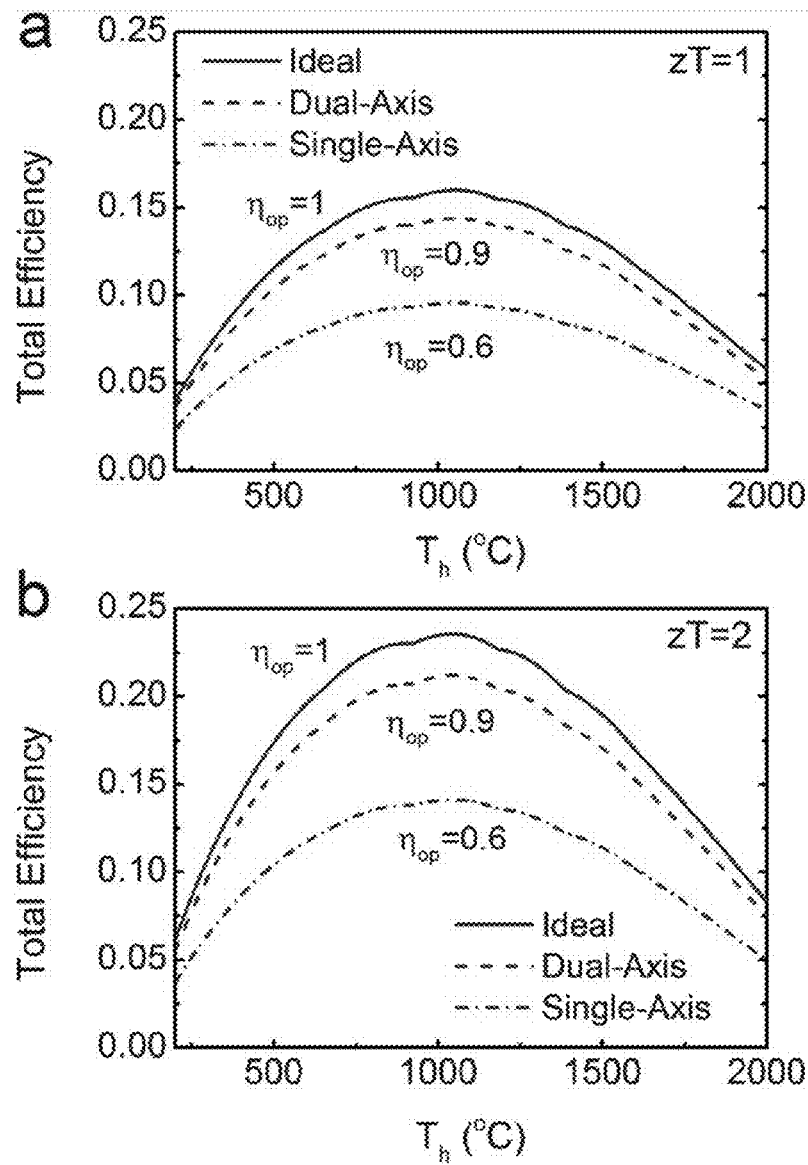
FIGS. 30(a)-(b) show the total system efficiency for ideal and realistic optical concentration systems.
Figure 31:
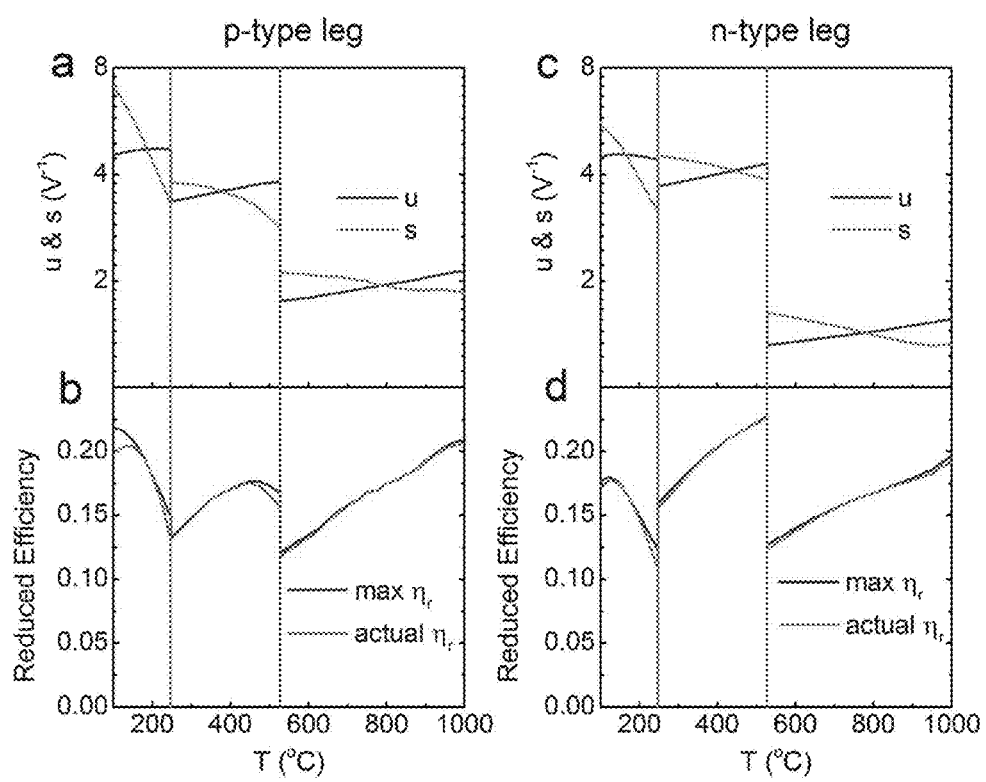
FIGS. 31(a)-(d) depict an optimized three-stage TE module using experimental data.

FIGS. 30(a)-(b) show the total system efficiency for ideal and realistic optical concentration systems. The single- and dual-axis tracking systems have efficiencies of 0.6 and 0.9, respectively. In FIG. 30(a) the STEG has zT=1. In FIG. 30(b) zT=2 (shown for q=100 kWm$^{-2}$).

FIGS. 31(a)-(d) depicts an optimized three-stage TE module using experimental data. By optimizing the reduced current density u, this value is never more than a factor of two different from the thermoelectric compatibility factors. This allows the actual reduced efficiency of each stage to be close to the calculated maximum reduced efficiency.

Figure 32:
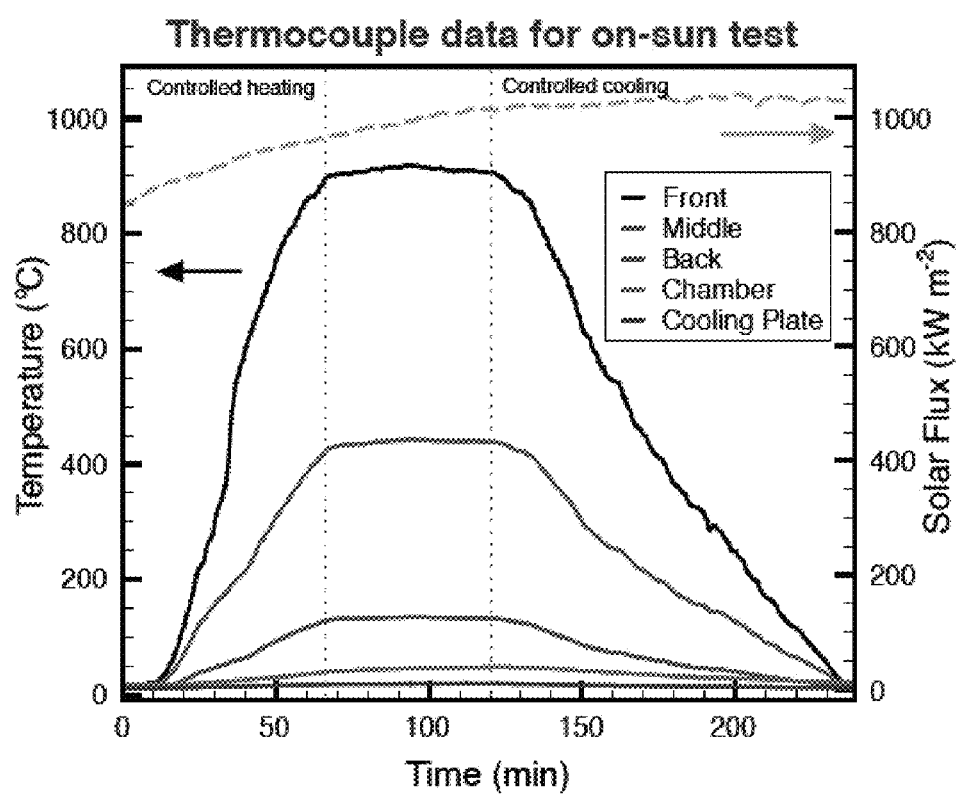
FIG. 32 shows the thermocouple data from an on-sun test.

FIG. 32 shows the thermocouple data from an on-sun test. Thermocouples were positioned on the front, middle, and back of the selective absorber sample or thermal dummy. Thermocouples were also positioned on the chamber and on the cooling plate. The solar absorber samples were heated to 1000° C. under ~300× solar concentration. Additionally, heat fluxes calculated by measuring the temperature gradient through the sample/dummy can be used to quantify absorber efficiency and loss mechanisms.

Figure 33:
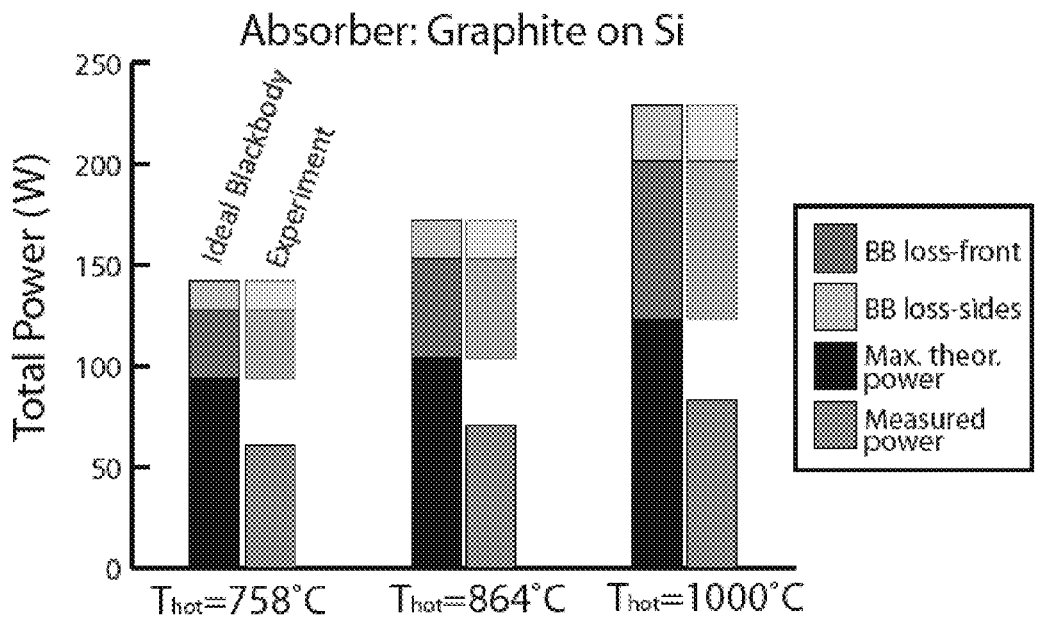
FIG. 33 is a graph showing an ideal blackbody compared to the experimental blackbody.
Figure 34:
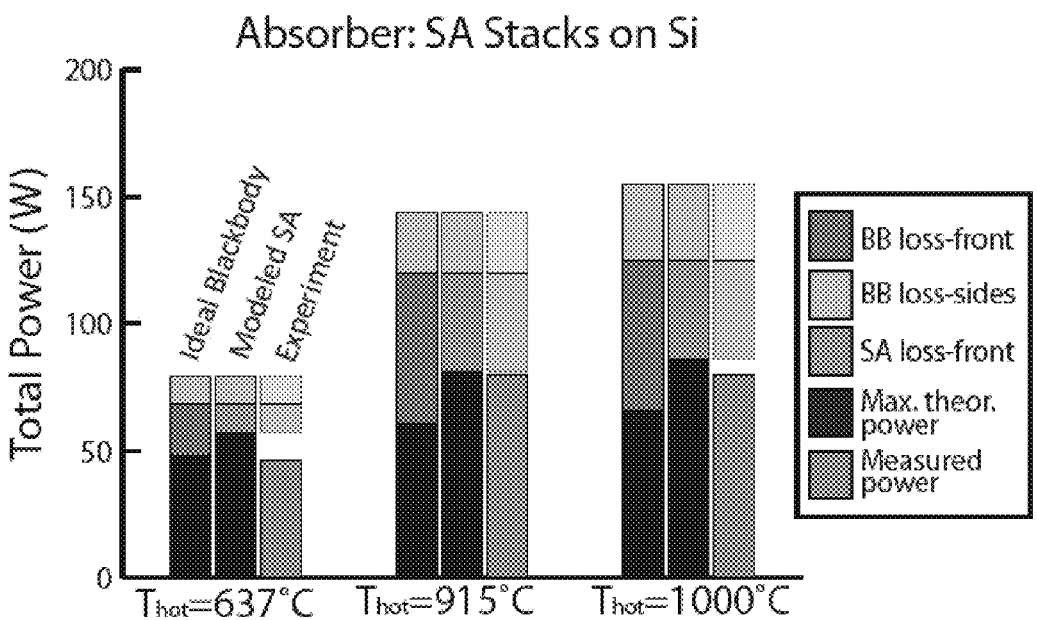
FIG. 34 compares an ideal blackbody to the modeled selective absorber and the experimental selective absorber.

FIG. 33 is a graph showing an ideal blackbody compared to the blackbody measured in the experiment, where the experiment blackbody is silicone coated with graphite. The total power and losses in different positions for the two blackbodies are compared at three different temperatures ($T_h$). FIG. 34 compares an ideal blackbody to the modeled selective absorber and the experimental selective absorber. The selective absorber is comprised of stacks positioned on silicone. The total power and losses in different positions for the three blackbodies are compared at three different temperatures ($T_h$). Comparing the graphs provided in FIGS. 33 and 34 show that the selective absorber samples out-perform graphite-coated samples (blackbody absorbers).

Figure 35:
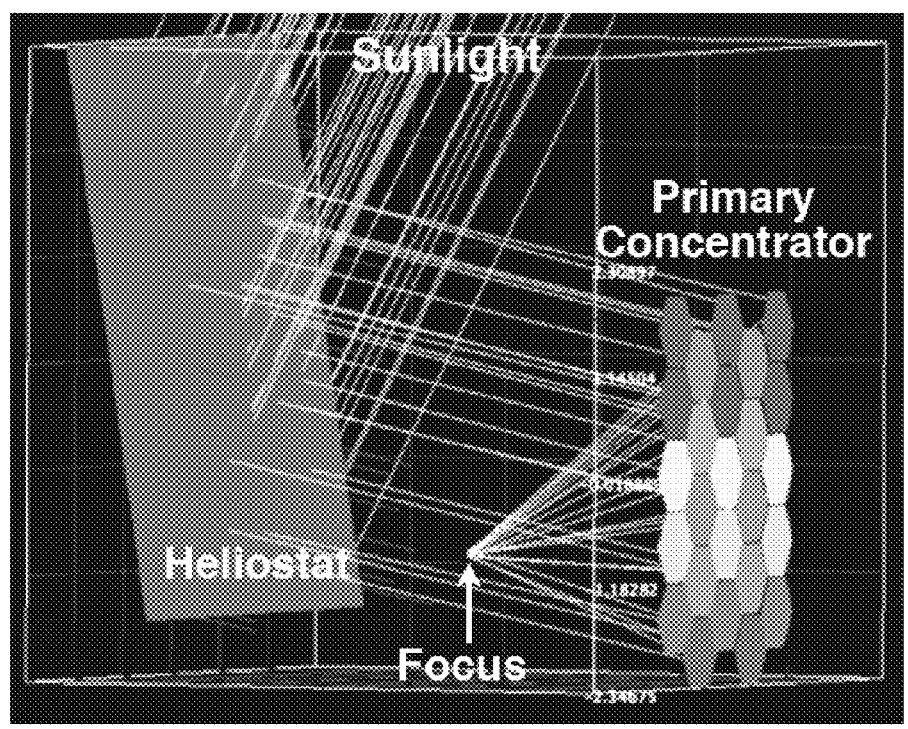
FIG. 35 shows a model of the heliostat and primary mirrors of the high flux solar furnace used to test the STEG prototype.

FIG. 35 shows a model of the heliostat and primary mirrors of the high flux solar furnace used to test the STEG prototype.

Figure 36:
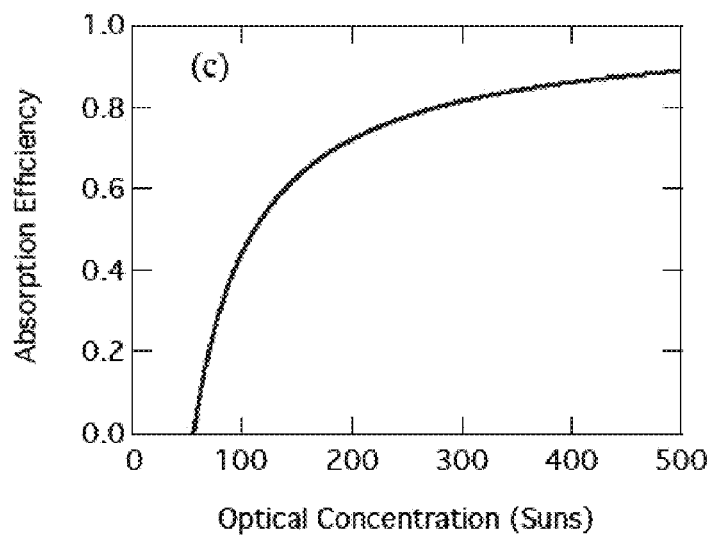
FIG. 36 is a graph of the absorption efficiency as a function of the optical concentration at the absorber surface.

FIG. 36 is a graph of the absorption efficiency as a function of the optical concentration at the absorber surface for a cavity where the ratio of the absorber area to aperture area is 2 ($A_d/A_w=2$) for $T_h=1000°$ C. Achieving the 15% STEG efficiency goal requires an absorber efficiency of 85%, which can be reached with concentration at the absorber of <300 Suns.

Figure 37:
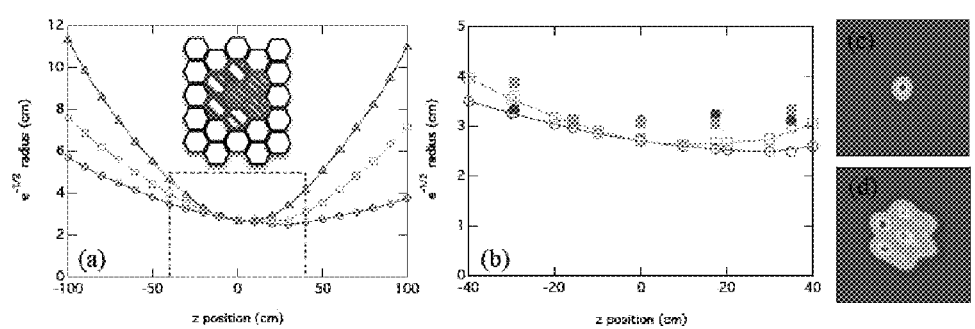
FIG. 37(a)-(d) show the geometry of the concentrated beam delivered by the high flux solar furnace.

FIGS. 37(a)-(d) show the geometry of the concentrated beam delivered by the high flux solar furnace. FIG. 37(a) shows a modeled Gaussian beam radius as a function of position for one mirror (circles), three mirrors (squares), and seven mirrors (triangles) of the primary concentrator. The insert in FIG. 37(a) is a schematic of the mirror subsets. FIG. 37(b) shows detail of the dashed box in FIG. 37(a). FIG. 37(b) further compares the modeled (open symbols) and the experimentally measured (solid symbols) sizes of the concentrated beam in the vicinity of the focus for the one- and three-mirror subarrays. Thus, it can be seen that there is agreement between the two. False-color modeled intensity profiles for the seven-mirror subarray are shown for z=0 cm (FIG. 37(c)) and z=80 cm (FIG. 37(d)) from the focus. Both FIGS. 37(c) and 37(d) show a 50 cm×50 cm area.

Figure 38:
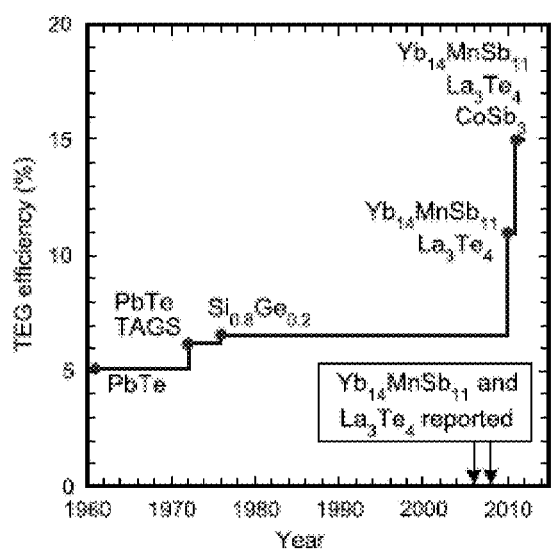
FIG. 38 demonstrates the dramatic rise in TEG efficiency over the years.

FIG. 38 demonstrates the dramatic rise in TEG efficiency over the years. The increase in efficiency can be attributed to the development of new thermoelectric materials with peak zT values in excess of unity. These efficiency gains have enabled new markets and opportunities for TEGs.

The foregoing description of the present invention has been presented for illustration and description purposes. However, the description is not intended to limit the invention to only the forms disclosed herein. In the foregoing Detailed Description for example, various features of the invention are grouped together in one or more embodiments for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

Consequently, variations and modifications commensurate with the above teachings and skill and knowledge of the relevant art are within the scope of the present invention. The embodiments described herein above are further intended to explain best modes of practicing the invention and to enable others skilled in the art to utilize the invention in such a manner, or include other embodiments with various modifications as required by the particular application(s) or use(s) of the present invention. Thus, it is intended that the claims be construed to include alternative embodiments to the extent permitted by the prior art.

The invention claimed is:

1. A solar thermoelectric generator comprising:
an optical concentrator to concentrate solar flux at a focal point;
a non-uniform cavity comprising:
a first end positioned proximate to the focal point, the first end comprising an aperture at the focal point;
a closed end positioned opposite the first end, the closed end comprising an upwardly-oriented surface facing the aperture; and
one or more side walls extending upwardly from the upwardly-oriented surface of the closed end to the first end, the one or more side walls having an interior surface;
a thermal absorber interconnected to the closed end of the non-uniform cavity and positioned below the non-uniform cavity, the thermal absorber comprising:
an upper surface facing the aperture of the non-uniform cavity and which has energy-dependent absorbtivity and emissivity, wherein the upper surface of the thermal absorber is positioned at the closed end of the non-uniform cavity and forms a portion of the upwardly-oriented surface of the closed end of the non-uniform cavity, wherein the aperture of the non-uniform cavity comprises a surface area which is smaller than a surface area of the upper surface of the thermal absorber, and wherein the interior surface of the one or more side walls of the non-uniform cavity comprises a reflective material to reflect emitted radiation to the upper surface of the thermal absorber; and
a lower surface opposite the upper surface of the thermal absorber;
a thermoelectric module positioned below the thermal absorber and in direct contact with the lower surface of the thermal absorber, the thermoelectric module comprising:
a first thermoelectric leg comprising p-type material and having a hot end and a cold end, wherein the hot end is interconnected to the lower surface of the thermal absorber,
a second thermoelectric leg comprising n-type material and having a hot end and a cold end, wherein the hot end is interconnected to the lower surface of the thermal absorber; and
an electrical connector to electrically connect the cold end of the first thermoelectric leg to the cold end of the second thermoelectric leg; and
a cooling system positioned below and in direct contact with the cold end of the first thermoelectric leg and the cold end of the second thermoelectric leg.

2. The solar thermoelectric generator of claim 1, wherein the aperture is at least one of a pin-hole and a slit.

3. The solar thermoelectric generator of claim 1, wherein the upper surface of the thermal absorber comprises a first layer, a second layer, and a substrate.

4. The solar thermoelectric generator of claim 3, wherein the first layer is a dielectric material and the second later is a metal material.

5. The solar thermoelectric generator of claim 1, wherein the upper surface of the thermal absorber comprises two or more selective absorber films.

6. The solar thermoelectric generator of claim 1, further comprising a vacuum enclosure positioned around the thermoelectric module, the thermal absorber, and at least a portion of the non-uniform cavity.

7. The solar thermoelectric generator of claim 1, wherein the non-uniform cavity comprises at least one photonic surface on the interior surface of the one or more side walls which create angular-emission restrictions to decrease radiative losses.

8. The solar thermoelectric generator of claim 7, wherein the one or more side walls have low thermal conductivity such that the one or more side walls are thermally insulating.

9. The solar thermoelectric generator of claim 1, wherein the thermoelectric module further comprises insulation.

10. A solar thermoelectric generator comprising:
an optical concentrator adapted to receive and concentrate a solar flux at a focal point;
a thermal absorber positioned below the optical concentrator, the thermal absorber comprising a first surface which has energy-dependent absorbtivity and emissivity and a second surface opposite the first surface;
a thermoelectric module interconnected to the second surface of the thermal absorber and positioned below the second surface of the thermal absorber, the thermoelectric module comprising:
(i) a first thermoelectric leg comprising a first end and a second end, wherein the first end is provided in direct contact with the second surface of the thermal absorber; and
(ii) a second thermoelectric leg comprising a first end and a second end, wherein the first end is in direct contact with the second surface of the thermal absorber, and wherein the first thermoelectric leg is provided in electrical communication with the second thermoelectric leg; and
an enclosure extending upwardly from the first surface of the thermal absorber, for receiving and reflecting at least a portion of the solar flux from the optical concentrator, the enclosure comprising:
(i) an upper portion having an aperture positioned at the focal point of the solar flux;
(ii) a lower portion positioned below the upper portion and in direct contact with the thermal absorber, wherein the lower portion is a closed end;
(iii) a predetermined height between the upper portion and the lower portion;
(iv) one or more walls extending from the closed end to the aperture; and
(v) an internal non-uniform cavity;
wherein the aperture receives at least a portion of the solar flux from the optical concentrator and transmits the at least a portion of the solar flux to the internal non-uniform cavity,
wherein the first surface of the thermal absorber is oriented toward the aperture and the internal non-uniform cavity,
wherein an interior surface of the one or more walls reflect emitted radiation to the first surface of the thermal absorber, and
wherein the first surface of the thermal absorber absorbs at least a portion of the solar flux.

11. The solar thermoelectric generator of claim 10, further comprising a vacuum enclosure positioned around the thermoelectric module, the thermal absorber, and at least a portion of the enclosure.

12. The solar thermoelectric generator of claim 10, wherein the enclosure comprises a frustoconical member.

13. The solar thermoelectric generator of claim 10, wherein the aperture comprises a surface area which is smaller than a surface area of the first surface of the thermal absorber.

14. The solar thermoelectric generator of claim 10, further comprising a cooling system in thermally conductive communication with at least one of the first thermoelectric leg and the second thermoelectric leg.

15. A method of manufacturing a solar thermoelectric generator according to claim 10 comprising:
   providing an optical concentrator adapted to concentrate a solar flux;
   providing a thermal absorber comprising a first surface which has energy-dependent absorbtivity and emissivity, and a second surface opposite the first surface;
   providing a thermoelectric module proximal to the thermal absorber,
   providing an enclosure for receiving and reflecting at least a portion of the solar flux, the enclosure comprising:
      (i) an upper portion;
      (ii) a lower portion proximal to the thermal absorber; and
      (iii) an internal cavity comprising a reflective material;
   providing an aperture in the upper portion of the enclosure;
   receiving at least a portion of the solar flux from the optical concentrator,
   transmitting the at least a portion of the solar flux through the aperture to the thermal absorber;
   reflecting solar flux emitted from the thermal absorber back to the thermal absorber, and
   converting the solar flux into electricity.

16. The method of manufacturing a solar thermoelectric generator of claim 15, further comprising providing the upper surface of the thermal absorber with two or more selective absorber films.

17. The method of manufacturing a solar thermoelectric generator of claim 15, further comprising providing a cooling system in thermally conductive communication with at least of a portion of the thermoelectric module.

18. The method of manufacturing a solar thermoelectric generator of claim 15, wherein the aperture comprises a surface area which is smaller than a surface area of the thermal absorber.

19. The method of manufacturing a solar thermoelectric generator of claim 15, further comprising providing the enclosure with at least one photonic surface.

20. The method of manufacturing a solar thermoelectric generator of claim 15, further comprising providing insulation for the thermoelectric module.

* * * * *